(12) United States Patent
Tomita

(10) Patent No.: US 9,837,365 B2
(45) Date of Patent: *Dec. 5, 2017

(54) SEMICONDUCTOR DEVICE

(71) Applicant: RENESAS ELECTRONICS CORPORATION, Tokyo (JP)

(72) Inventor: Kazuo Tomita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/280,549

(22) Filed: Sep. 29, 2016

(65) Prior Publication Data

US 2017/0018512 A1   Jan. 19, 2017

Related U.S. Application Data

(63) Continuation of application No. 14/560,985, filed on Dec. 4, 2014, now Pat. No. 9,466,575, which is a (Continued)

(30) Foreign Application Priority Data

Jun. 21, 2004   (JP) .................................. 2004-182366

(51) Int. Cl.
*H01L 23/544* (2006.01)
*H01L 23/58* (2006.01)
(Continued)

(52) U.S. Cl.
CPC ............ *H01L 23/585* (2013.01); *H01L 21/78* (2013.01); *H01L 23/522* (2013.01);
(Continued)

(58) Field of Classification Search
USPC .... 257/620, 774, 632, 758, E23.11, E23.002
See application file for complete search history.

(56) References Cited

U.S. PATENT DOCUMENTS 5,831,330 A    11/1998  Chang
6,037,668 A     3/2000  Cave et al.
(Continued)

FOREIGN PATENT DOCUMENTS

JP    2000-150521         5/2000
JP    2000-340568 A      12/2000
(Continued)

OTHER PUBLICATIONS

Office Action dated Jul. 17, 2012, in Japanese patent Application No. 2009-233128 (with partial English-language translation.
(Continued)

*Primary Examiner* — Timor Karimy
(74) *Attorney, Agent, or Firm* — Oblon, McClelland, Maier & Neustadt, L.L.P.

(57) ABSTRACT

The present disclosure provides a technique for improving the reliability of a semiconductor device where spreading of cracking that occurs at the time of dicing to a seal ring can be restricted even in a semiconductor device with a low-k film used as an interlayer insulating film. Vias are formed in each layer on a dicing region side. The vias are formed at the same intervals in a matrix as viewed in a top view. Even in the case where cracking occurs at the time of dicing, the cracking can be prevented from spreading to a seal ring by the vias. As a result, resistance to moisture absorbed in a circuit formation region can be improved, and deterioration in reliability can be prevented.

14 Claims, 32 Drawing Sheets

Related U.S. Application Data continuation of application No. 14/068,666, filed on Oct. 31, 2013, now Pat. No. 8,921,982, which is a continuation of application No. 13/532,459, filed on Jun. 25, 2012, now Pat. No. 8,604,592, which is a continuation of application No. 12/107,599, filed on Apr. 22, 2008, now Pat. No. 8,330,253, which is a continuation of application No. 11/154,745, filed on Jun. 17, 2005, now Pat. No. 7,400,028.

(51) Int. Cl.
  *H01L 23/522* (2006.01)
  *H01L 23/00* (2006.01)
  *H01L 21/78* (2006.01)
  *H01L 23/528* (2006.01)

(52) U.S. Cl.
  CPC ........ *H01L 23/528* (2013.01); *H01L 23/5226* (2013.01); *H01L 23/562* (2013.01); *H01L 2924/0002* (2013.01)

(56) References Cited

U.S. PATENT DOCUMENTS

| | | |
|---|---|---|
| 6,396,158 B1 | 5/2002 | Travis et al. |
| 6,614,120 B2 | 9/2003 | Sato et al. |
| 6,861,755 B2 | 3/2005 | Hosoda et al. |
| 6,939,726 B2 | 9/2005 | Hsu et al. |
| 8,330,253 B2 | 12/2012 | Tomita |
| 8,604,592 B2 | 12/2013 | Tomita |
| 8,921,982 B2 | 12/2014 | Tomita |
| 9,466,575 B2 * | 10/2016 | Tomita .................. H01L 23/522 |
| 2003/0003703 A1 | 1/2003 | Barth et al. |
| 2004/0002198 A1 | 1/2004 | Lee et al. |
| 2004/0084777 A1 | 5/2004 | Yamanoue et al. |
| 2004/0150073 A1 | 8/2004 | Matumoto et al. |
| 2006/0278957 A1 | 12/2006 | Lin et al. |

FOREIGN PATENT DOCUMENTS

| | | |
|---|---|---|
| JP | 2001-168093 A | 6/2001 |
| JP | 2001-274338 | 10/2001 |
| JP | 2002-208676 | 7/2002 |
| JP | 2003-45876 | 2/2003 |
| JP | 2003-297918 A | 10/2003 |
| JP | 2004-153015 | 5/2004 |

OTHER PUBLICATIONS

Japanese Office Action dated Nov. 20, 2012, in Japan Patent Application No. 2009-233128 (with English translation).

Office Action dated Feb. 25, 2014 in the Japanese Counterpart Patent Application No. 2013-007194 (with partial English translation).

* cited by examiner

F I G. 4
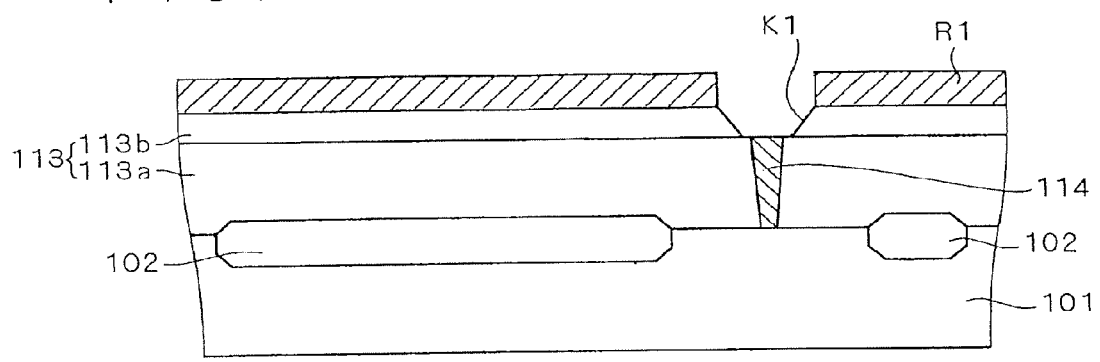
F I G. 5
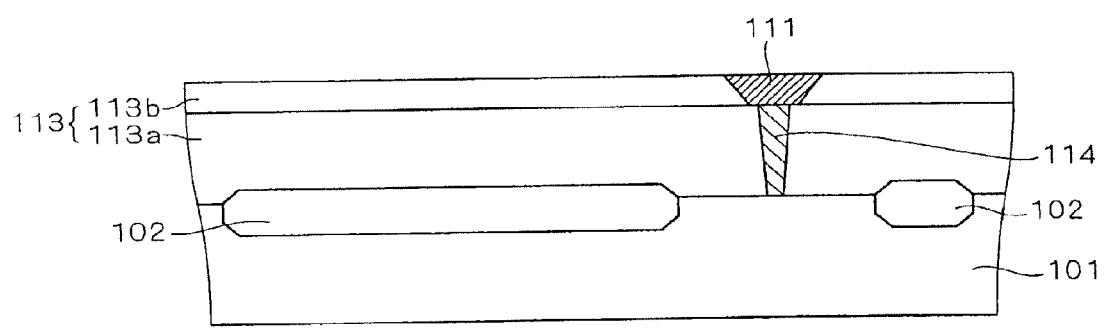

F I G . 8
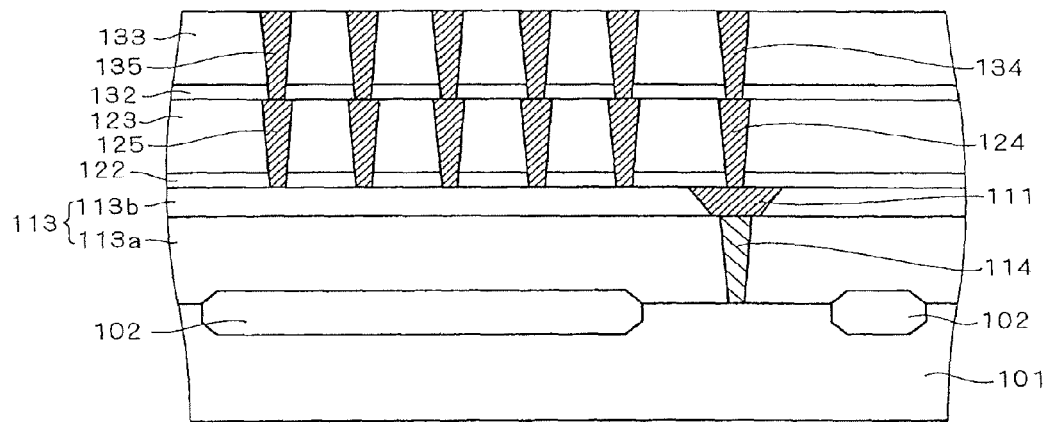

F I G . 1 5
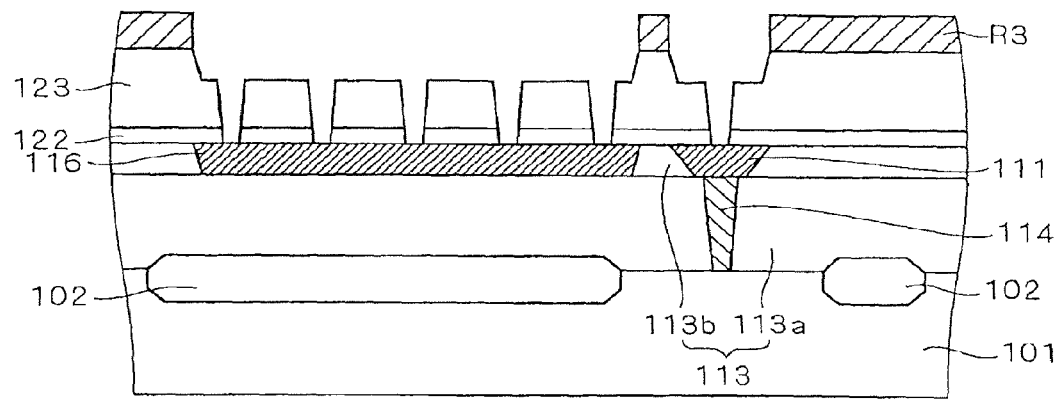
F I G . 1 6
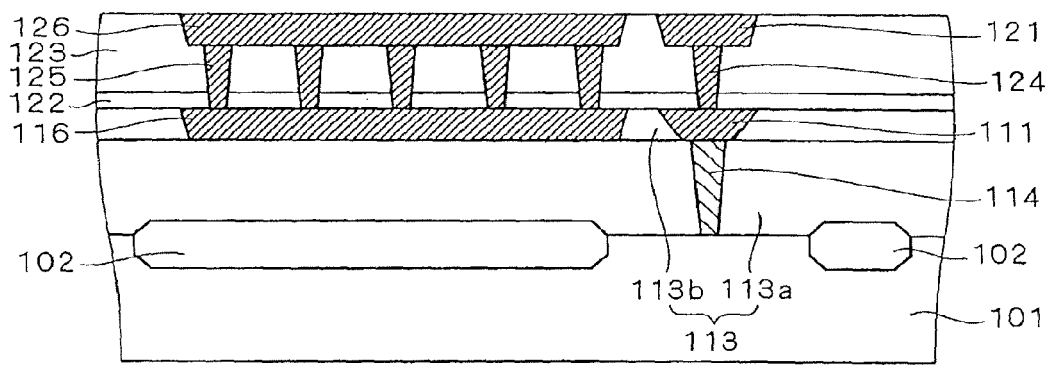

F I G . 2 0
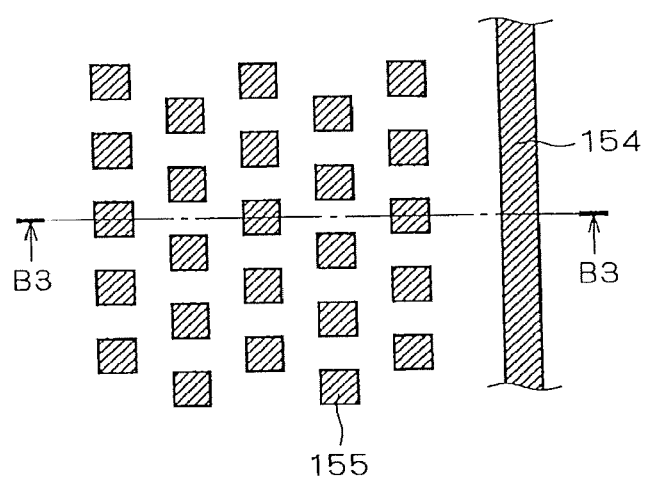

F I G . 2 4
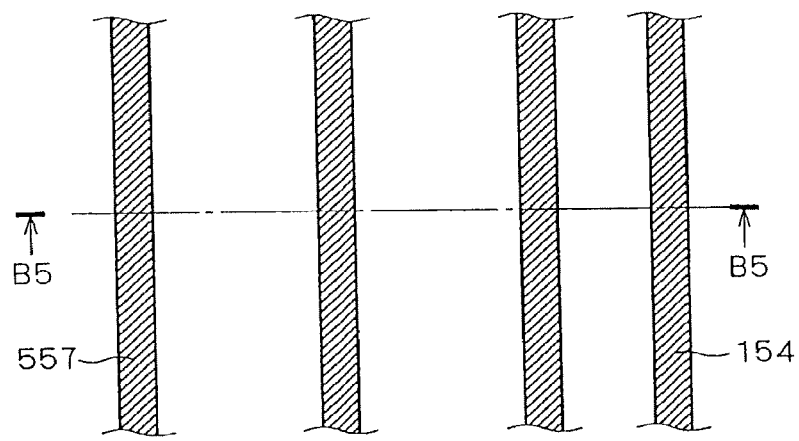

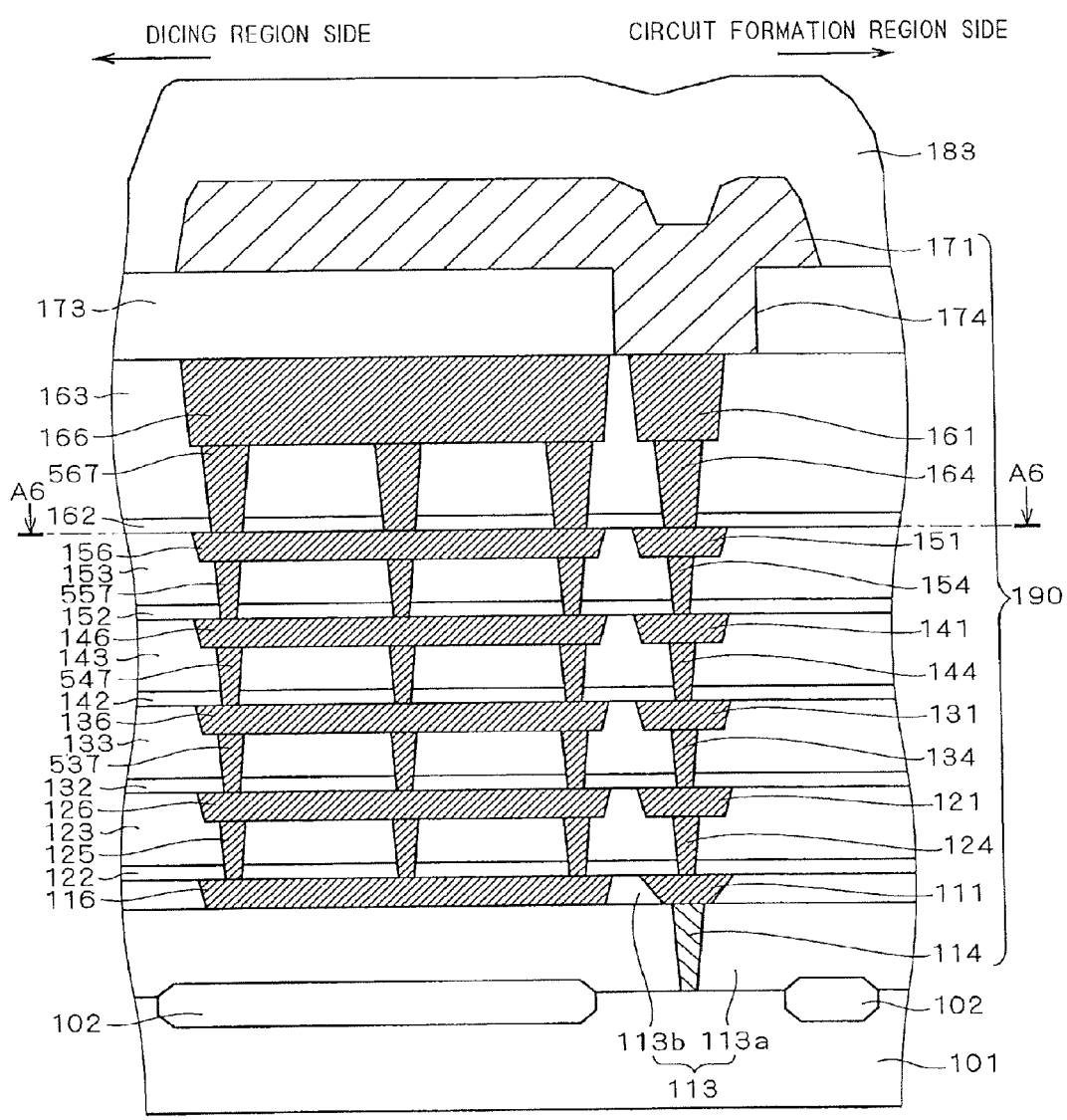

F I G . 2 7
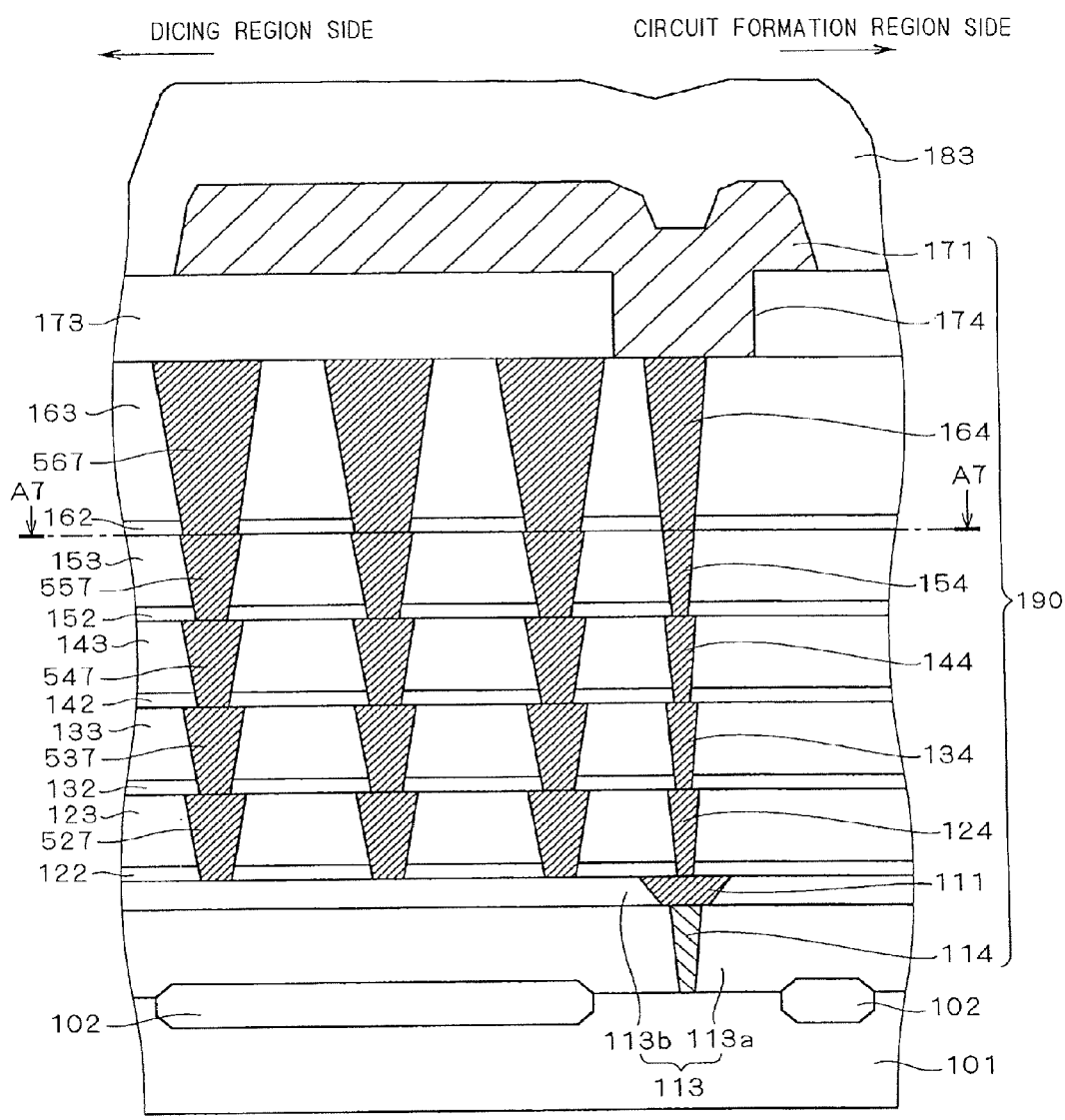

F I G . 2 8
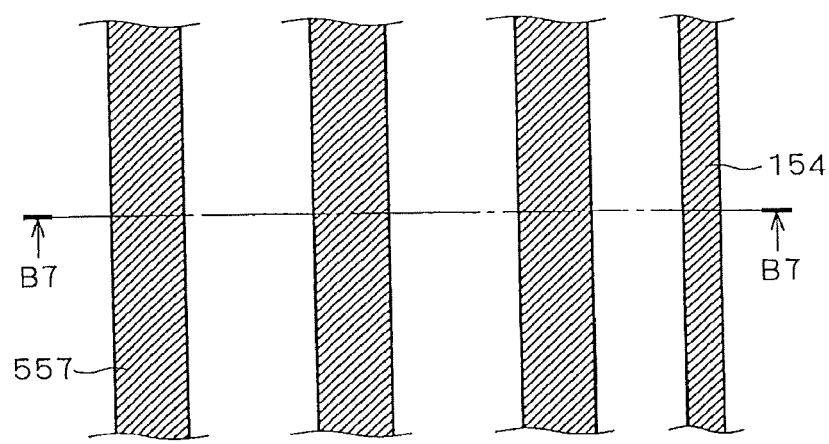

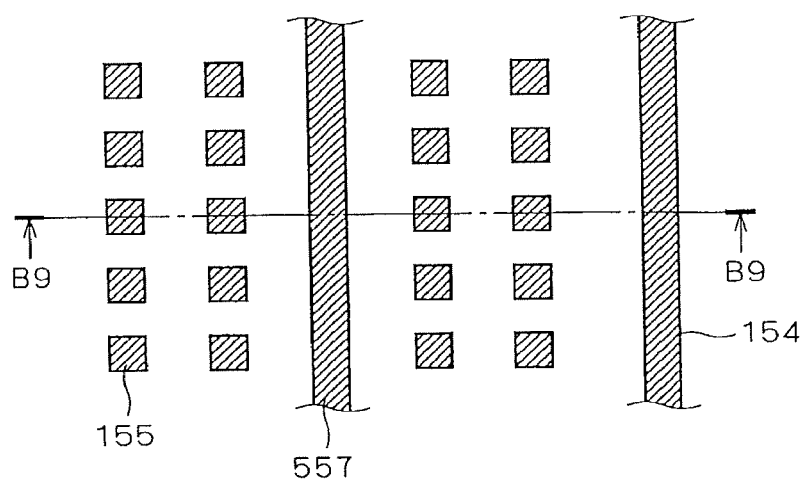
F I G . 3 2

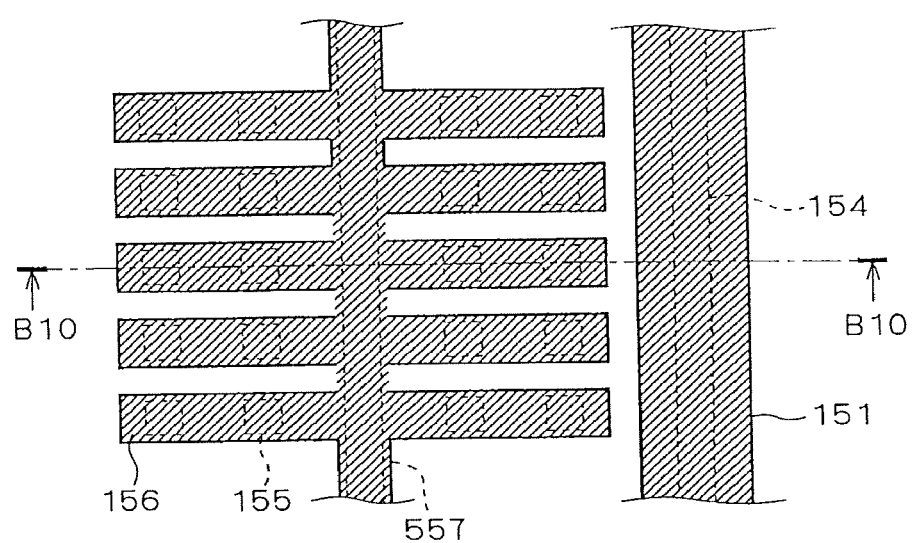
F I G . 3 4

SEMICONDUCTOR DEVICE

CROSS REFERENCE TO RELATED APPLICATIONS

This application is a continuation application of, and claims the benefit of priority under 35 U.S.C. §120 from, U.S. application Ser. No. 14/560,985, filed Dec. 4, 2014, which is a continuation of U.S. Pat. No. 8,921,982, issued Dec. 30, 2014; herein incorporated by reference, which is a continuation of U.S. Pat. No. 8,604,592, issued Dec. 10, 2013; which is a continuation of U.S. Pat. No. 8,330,253, issued Dec. 11, 2012; which is continuation of U.S. Pat. No. 7,400,028, issued Jul. 15, 2008; which claims the benefit of priority under 35 U.S.C. §119 from Japanese Patent Application No. 2004-182366, filed Jun. 21, 2004.

BACKGROUND OF THE INVENTION

Field of the Invention

The present invention relates to a seal ring which is a protective structure for a semiconductor device.

Description of the Background Art

A protective structure called a seal ring, a die edge seal or a guard ring is provided on an inside of a dicing line, i.e., in the vicinity of an edge of a chip (die) in order to protect a circuit formation region of a semiconductor device from influence due to moisture and ions in outer atmosphere. The seal ring is formed of an interconnecting layer and a contact which are the same as those in the circuit formation region and is formed so as to surround the circuit formation region of the semiconductor device.

The circuit formation region of the semiconductor device can be protected from the influence due to moisture and ions in outer atmosphere by the existence of the seal ring, so that characteristics of this semiconductor device can be stabilized for a long period of time.

In addition, the seal ring has the function of suppressing the occurrence of cracking in the circuit formation region at the time of dicing in a dicing region. At the time of dicing, cracking may occur in the dicing region in some cases; however, such cracking can be prevented from reaching the circuit formation region by the existence of the seal ring between the dicing region and the circuit formation region.

Japanese Patent Application Laid-Open No. 2002-208676 discloses the following technique. A seal ring is formed and a plurality of dummy patterns are provided in a circuit formation region. Then, the flatness in a chip edge can be improved in a flattening process in accordance with a CMP (Chemical Mechanical Polishing) method.

In recent years, reduction in resistance of a interconnecting has become more important as miniaturization and increase in integration of a structure of a semiconductor device and increase in speed of an operation have advanced. Accompanying this, Cu (copper) having a comparatively small resistance has become widely used as an interconnecting material. More specifically, the number of cases where copper is utilized in the above-mentioned seal ring structure is increasing. In addition, a so-called low-k film (k<3.0) having a low specific dielectric constant k has become widely used as an interlayer insulating film.

In the case where such a low-k film is used as an interlayer insulating film, a problem arises where cracking that occurs at the time of dicing easily exceeds the seal ring and reaches the circuit formation region, so that the circuit formation region is negatively affected. In addition, in the case where cracking does not reach the circuit formation region but reaches the seal ring, a problem arises where resistance to absorbed moisture of the semiconductor device deteriorates.

SUMMARY OF THE INVENTION

An object of the present invention is to provide a technique for improving the reliability of a semiconductor device by preventing cracking that occurs at the time of dicing from reaching a seal ring even in the case where a low-k film is used as an interlayer insulating film.

According to a first aspect of the present invention, a semiconductor device includes an interlayer insulating film having a specific dielectric constant of 3 or less, a seal ring formed within the interlayer insulating film in the vicinity of an edge of a semiconductor chip so as to surround a circuit formation region of the semiconductor chip, and a dummy pattern which is formed within the interlayer insulating film so as to surround the seal ring in a dicing region of the semiconductor chip.

According to the present invention, a dummy pattern is formed so as to surround a seal ring on a dicing region side of a semiconductor chip. Therefore, even in the case where cracking occurs at the time of dicing, the cracking can be restricted from spreading by the dummy pattern and can be prevented from reaching the seal ring.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates a manufacturing process for the semiconductor device according to the first embodiment;

FIG. 5 illustrates a manufacturing process for the semiconductor device according to the first embodiment;

FIG. 8 illustrates a manufacturing process for the semiconductor device according to the first embodiment;

FIG. 15 illustrates a manufacturing process for the semiconductor device according to the second embodiment;

FIG. 16 illustrates a manufacturing process for the semiconductor device according to the second embodiment;

FIG. 20 is a top view showing the configuration of the semiconductor device according to the third embodiment;

FIG. 24 is a top view showing the configuration of the semiconductor device according to the fifth embodiment;

FIG. 25 is a sectional view showing a configuration of a semiconductor device according to a sixth embodiment;

FIG. 27 is a sectional view showing a configuration of a semiconductor device according to a seventh embodiment;

FIG. 28 is a top view showing the configuration of the semiconductor device according to the seventh embodiment;

FIG. 32 is a top view showing the configuration of the semiconductor device according to the ninth embodiment;

FIG. 34 is a top view showing the configuration of the semiconductor device according to the tenth embodiment;

DESCRIPTION OF THE PREFERRED EMBODIMENTS

First Embodiment

Figure 1:
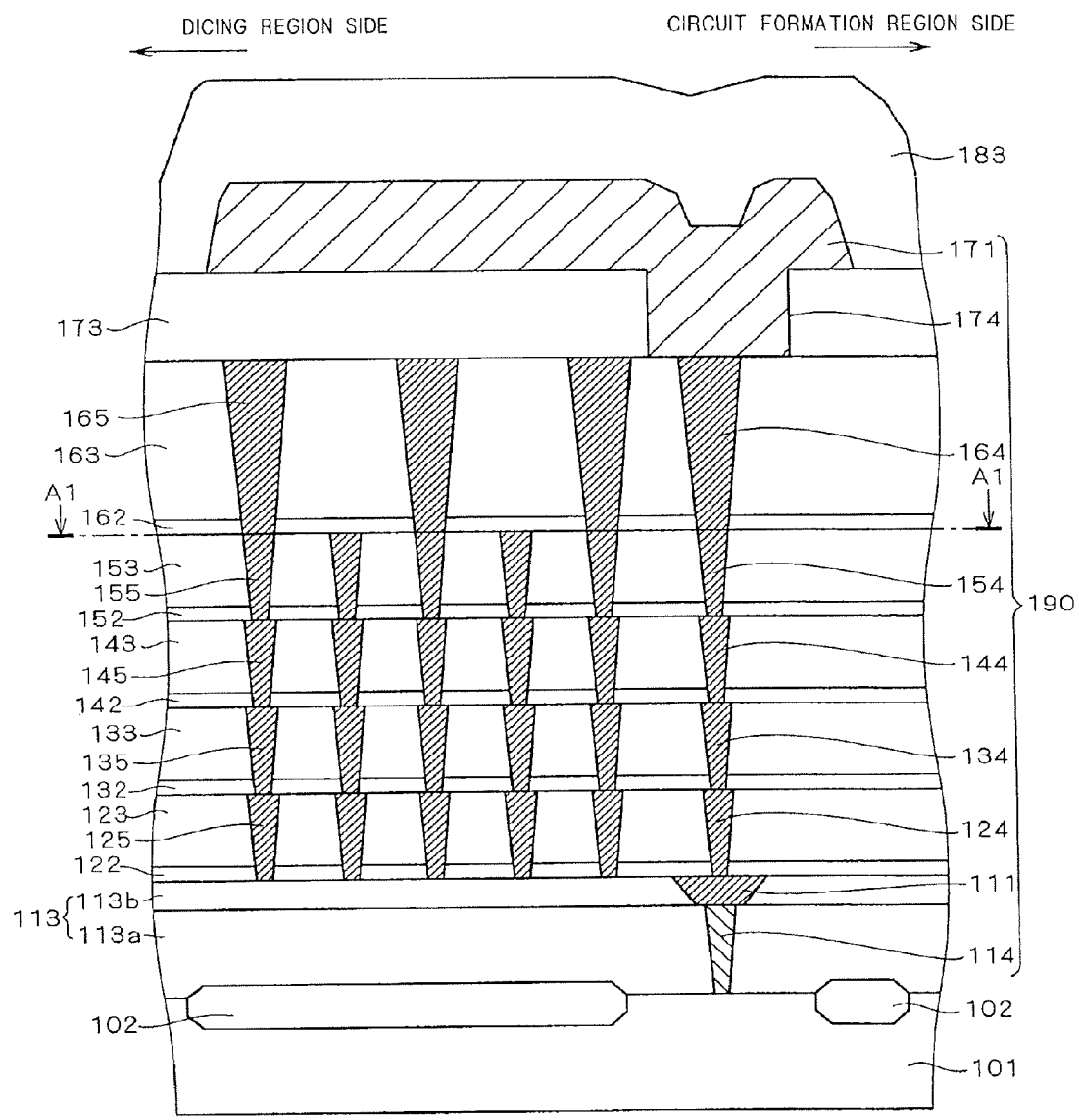
FIG. 1 is a sectional view showing a configuration of a semiconductor device according to a first embodiment.
Figure 2:
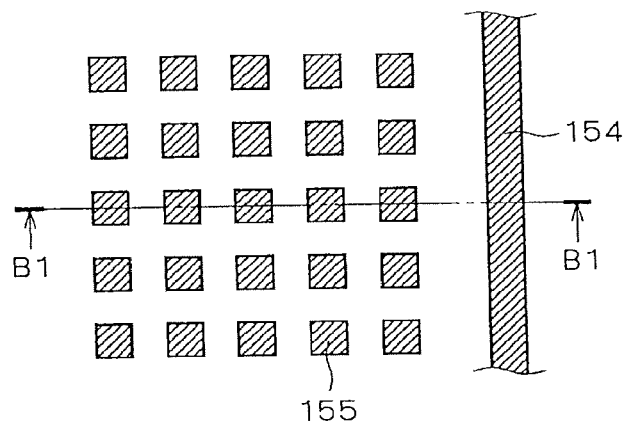
FIG. 2 is a top view showing the configuration of the semiconductor device according to the first embodiment.

FIG. 1 shows a configuration of a semiconductor device according to a first embodiment, which is an enlarged sectional view of a region where a seal ring is formed. FIG. 2 is a top view of the semiconductor device viewed along line A1-A1 of FIG. 1. In addition, FIG. 1 is also a sectional view taken along line B1-B1 of FIG. 2. A circuit formation region is to the right and a dicing region is to the left of the region shown in FIG. 1, respectively.

Here, semiconductor chips are aligned in a matrix on a semiconductor wafer and the respective semiconductor chips are separated by a dicing region. A circuit formation region is formed in a semiconductor chip and a seal ring is placed around the circuit formation region. Namely, the seal ring is formed to surround the circuit formation region. FIG. 1 shows an end surface of such a semiconductor chip and, also, shows the vicinity of an edge (region where a seal ring is formed) of a semiconductor chip.

In the same figure, the circuit portion of the semiconductor device is omitted. In addition, FIG. 1 shows the case of a semiconductor device which is provided with a structure of Cu interconnectings in six layers and Al interconnectings in one layer.

An interlayer insulating film 113 is formed on a silicon substrate 101 where a trench isolation (element isolation) film 102 is formed. The trench isolation film 102 is formed of, for example, an oxide film having a thickness of 300 nm. The interlayer insulating film 113 is formed of an interlayer insulating film 113a and a first interconnecting insulating film 113b. Thus, the interlayer insulating film 113a is formed of, for example, a USG (Undoped Silicon Glass) film having a thickness 500 nm and the first interconnecting insulating film 113b is formed of, for example, a plasma TEOS (Tetraethyl orthosilicate) film having a thickness of 300 nm.

A W (tungsten) plug 114 in slit form is formed in the interlayer insulating film 113a. In addition, a barrier metal having a structure of TiN (titanium nitride)/Ti (titanium) is formed and W is filled into the W plug 114. An interconnecting layer 111 is formed on the W plug 114. The interconnecting layer 111 is made by burying Cu in a barrier metal having a structure of Ta (tantalum)/TaN (tantalum nitride).

A Cu diffusion prevention insulating film (which may also be referred to as etching stopper film or liner film, and hereinafter simply referred to as diffusion prevention film) 122 is formed on the interlayer insulating film 113. An interlayer insulating film 123 is formed on the diffusion prevention film 122. In addition, a plurality of dummy vias 125 and a slit via 124 in slit form are formed in the interlayer insulating film 123. The slit via 124 is formed on the interconnecting layer 111. In addition, the dummy vias 125 are formed on the dicing region side.

A diffusion prevention film 132 is formed on the interlayer insulating film 123. An interlayer insulating film 133 in which a plurality of dummy vias 135 and a slit via 134 in slit form are formed is formed on the diffusion prevention film 132. The slit via 134 is formed on the slit via 124. In addition, the dummy vias 135 are formed on the dummy vias 125.

A diffusion prevention film 142 is formed on the interlayer insulating film 133. An interlayer insulating film 143 in which a plurality of dummy vias 145 and a slit via 144 in slit form are formed is formed on the diffusion prevention film 142. The slit via 144 is formed on the slit via 134. In addition, the dummy vias 145 are formed on the dummy vias 135.

A diffusion prevention film 152 is formed on the interlayer insulating film 143. An interlayer insulating film 153 in which a plurality of dummy vias 155 and a slit via 154 in slit form are formed is formed on the diffusion prevention film 152. The slit via 154 is formed on the slit via 144. In addition, the dummy vias 155 are formed on the dummy vias 145.

A diffusion prevention film 162 is formed on the interlayer insulating film 153. An interlayer insulating film 163 in which a plurality of dummy vias 165 and a slit via 164 in slit form are formed is formed on the diffusion prevention film 162. The slit via 164 is formed to make contact with the slit via 154. In addition, the dummy vias 165 are formed to make contact with the dummy vias 155.

As shown in FIG. 2, the dummy vias 155 in the fifth layer have a diameter of, for example, 0.14 μm and are aligned at the same intervals in a matrix with a pitch of, for example, 1 μm. The dummy vias formed in the second to fourth layers are formed in the same manner. In addition, the dummy vias 165 have a diameter of 0.28 μm and are aligned at the same intervals in a matrix with a pitch of, for example, 2 μm.

The diffusion prevention films 122, 132, 142, 152 and 162 are formed of, for example, SiC (silicon carbide) films (k to 4.8) having a thickness of 50 nm. In addition, the interlayer insulating films 123, 133, 143 and 153 are formed of SiOC films (carbon-containing silicon oxide films) (k to 2.8) which are low-k films so as to have a film thickness of 500 nm. The interlayer insulating film 163 is formed of a USG film (k to 4.1) having a thickness of approximately 1000 nm.

The slit vias 123, 134, 144, 154 and 164 as well as the dummy vias 125, 135, 145, 155 and 165 are made by burying Cu in a barrier metal having a structure of Ta (tantalum)/TaN (tantalum nitride).

A passivation film 173 is formed on the interlayer insulating film 163. The passivation film 173 is formed of, for example, a plasma SiN (silicon nitride) film (k to 7) having a thickness of 500 nm. In addition, a hole 174 is formed in the first passivation film 173. In addition, an Al (aluminum) interconnecting layer 171 is formed on the first passivation film 173.

The Al interconnecting layer 171 is formed of an Al (aluminum) layered film that contains a barrier metal TiN/Ti film. Thus, the Al interconnecting layer 171 is formed so as to have a film thickness of 1000 nm. A second passivation film 183 is formed so as to cover the Al interconnecting layer 171. The second passivation film 183 is formed of, for example, a plasma SiN film so as to have a thickness of 1000 nm.

Herein, the W plug 114, the interconnecting layer 111, the slit vias 124, 134, 144, 154 and 164 as well as the Al interconnecting layer 171 form a seal ring 190.

In addition, the dummy vias 125, 135, 145, 155 and 165 are placed around the seal ring 190. Namely, the dummy vias 125, 135, 145, 155 and 165 (dummy pattern) are formed so as to surround the seal ring 190.

FIGS. 3 to 9 illustrate a manufacturing process for the semiconductor device shown in FIG. 1. In the following, a manufacturing method for a semiconductor device according to this embodiment will be described with reference to these figures.

Figure 3:
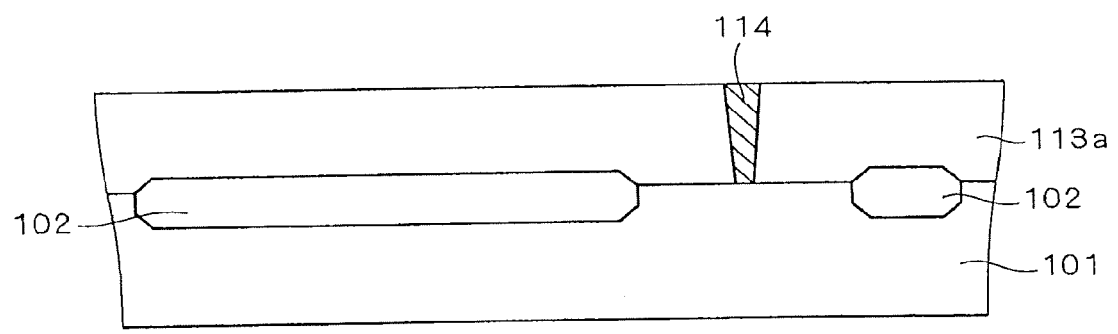
FIG. 3 illustrates a manufacturing process for the semiconductor device according to the first embodiment.

In the process shown in FIG. 3, a trench isolation film 102 having a thickness of, for example, 300 nm is formed in a silicon substrate 101 in accordance with an STI (Shallow Trench Isolation) method. Next, an HDP (High Density Plasma) oxide film having a thickness of, for example, 800 nm is deposited and 300 nm are polished off in accordance with a CMP (Chemical Mechanical Polishing) method, and thereby, an interlayer insulating film 113a is formed. In addition, an opening in slit form is formed in a portion of the interlayer insulating film 113a that corresponds to a seal ring 190 by means of dry etching using a resist mask having a width of, for example, 0.10 μm. At this time, etching is carried out in a condition where the silicon substrate 101 and the interlayer insulating film 113a have a sufficient etching selection ratio.

Subsequently, a barrier metal (not shown) is formed by respectively depositing 20 nm of, for example, TiN and Ti in accordance with a CVD (Chemical Vapor Deposition) method, and then, 200 nm of tungsten is deposited, also in accordance with a CVD method. After that, tungsten and the barrier metal on the interlayer insulating film 113a are removed in accordance with a CMP method, and thereby, a W plug 114 in slit form is formed.

Next, a 300 nm plasma TEOS film is deposited on the interlayer insulating film 113a so as to form a first interconnecting insulating film 113b. A resist mask R1 is formed on the first interconnecting insulating film 113b, and the plasma TEOS film is etched using the resist mask R1, and thereby, an opening K1 in which an interconnecting layer 111 is to be formed is formed above the W plug 114 (FIG. 4).

Next, after the resist mask R1 has been removed, 10 nm films of TaN and Ta are respectively formed in accordance with a sputtering method, and thereby, a barrier metal (not shown) is formed, and subsequently, 100 nm of Cu is deposited in accordance with a sputtering method so as to form a seed (not shown). Then, 1000 nm of Cu, which is the material for the interconnecting layer 111, is deposited in accordance with a plating method. After this, Cu and the barrier metal on the interlayer insulating film 113 are removed in accordance with a CMP method, and thereby, the interconnecting layer 111 is formed (FIG. 5).

Figure 6:
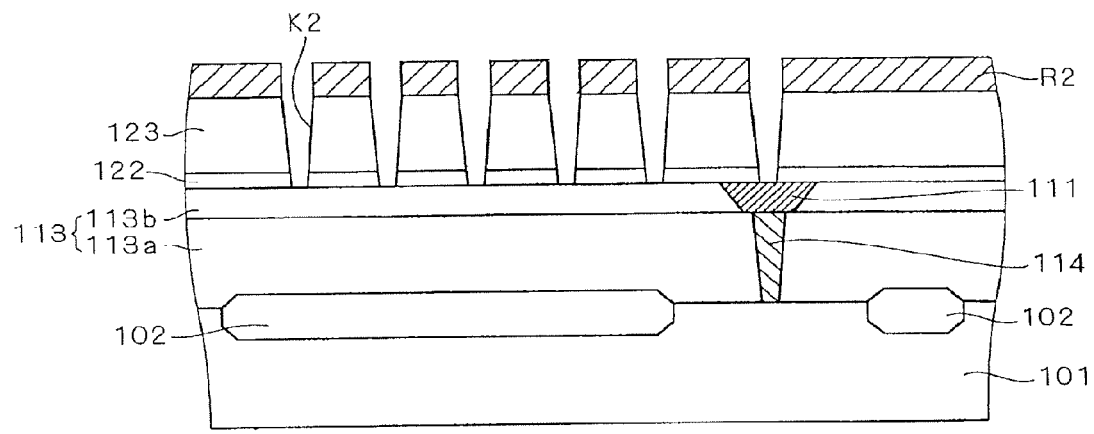
FIG. 6 illustrates a manufacturing process for the semiconductor device according to the first embodiment.

Next, a 50 nm plasma SiC film is deposited, and thereby, a diffusion prevention film 122 is formed. Subsequently, a 600 nm plasma SiOC film, for example, is deposited and 200 nm is polished off in accordance with a CMP method, and thereby, an interlayer insulating film 123 is formed. After that, the interlayer insulating film 123 is dry etched using a resist mask R2 so as to form openings K2 in which dummy vias 125 and a slit via 124 for forming a seal ring 190 are to be formed (FIG. 6).

At this time, an opening (not shown) in which a second via is formed is formed simultaneously with the openings K2 for the dummy vias 125 and the slit via 124 in the circuit formation region (not shown).

Figure 7:
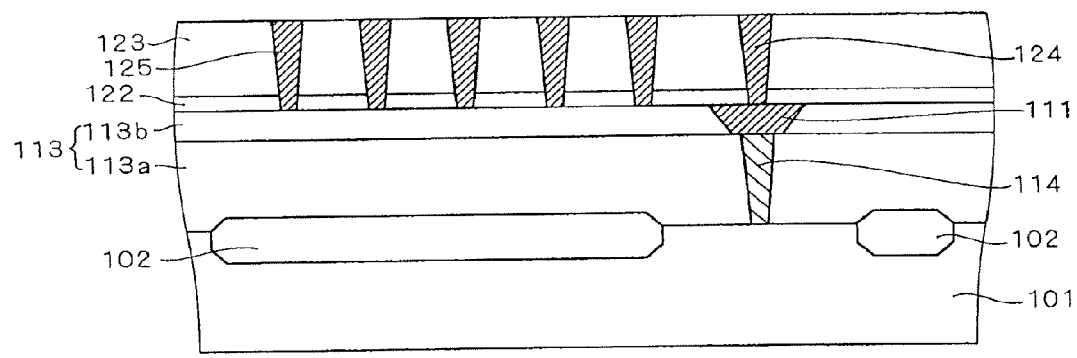
FIG. 7 illustrates a manufacturing process for the semiconductor device according to the first embodiment.

Next, after an opening (not shown) in which a second interconnecting layer is formed has been formed in the circuit formation region, 10 nm of Ta and TaN are respectively deposited in accordance with a sputtering method. Then, 100 nm of Cu is deposited in accordance with a sputtering method so as to form a seed (not shown). After that, 1000 nm of Cu is deposited in accordance with a plating method, and Cu and the barrier metal on the interlayer insulating film 123 are removed in accordance with a CMP method. Thus, the dummy vias 125 and the slit via 124 are formed (FIG. 7). In addition, the second via and the second interconnecting layer are simultaneously formed in the circuit formation region.

Next, a 50 nm plasma SiC film is deposited, and thereby, a diffusion prevention film 132 is formed. Subsequently, a 600 nm plasma SiOC film, for example, is deposited and 200 nm is polished off in accordance with a CMP method, and thereby, an interlayer insulating film 133 is formed. After that, the interlayer insulating film 133 is dry etched using a resist mask, and thereby, openings in which dummy vias 135 and a slit via 134 for forming the seal ring 190 are formed are formed.

At this time, an opening (not shown) in which a third via is formed is formed simultaneously with the openings for the dummy vias 135 and the slit via 134 in the circuit formation region, not shown here.

Next, an opening in which a third interconnecting layer is formed is formed in the circuit formation region. After that, 10 nm of Ta and TaN are respectively deposited in accordance with a sputtering method.

Next, 100 nm of Cu is deposited in accordance with a sputtering method, and thereby, a seed is formed. After that, 1000 nm of Cu is deposited in accordance with a plating method, and Cu and the barrier metal on the interlayer insulating film 133 are removed in accordance with a CMP method. Thus, the dummy vias 135 and the slit via 134 are formed (FIG. 8). In addition, the third via and the third interconnecting layer are simultaneously formed in the circuit formation region.

Dummy vias 145 and 155, as well as slit vias 144 and 154 in the fourth and fifth layers are formed in accordance with the same procedure. In addition, at the same time, fourth and fifth vias, as well as fourth and fifth interconnecting layers are formed in the circuit formation region. The method for formation is the same as that for the second and third layers, and the description thereof is omitted.

Figure 9:
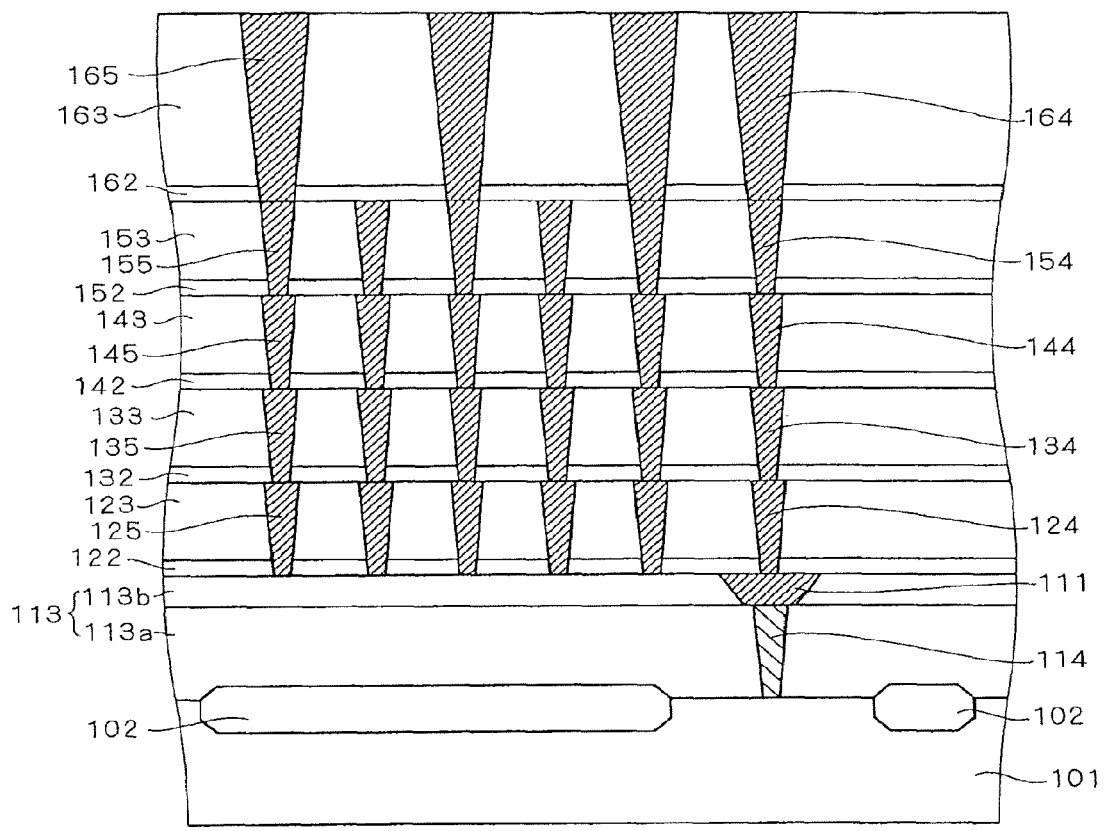
FIG. 9 illustrates a manufacturing process for the semiconductor device according to the first embodiment.

Next, in the process shown in FIG. 9, a 50 nm plasma SiC film, for example, is deposited, and thereby, a diffusion prevention film 162 is formed. Subsequently, a 1200 nm plasma TEOS film, for example, is deposited and 200 nm is polished off in accordance with a CMP method, and thereby, an interlayer insulating film 163 is formed. After that, dummy vias 165 and a slit via 164 for forming the seal ring 190 are formed in the interlayer insulating film 163. At the same time, a sixth via and a sixth interconnecting layer are formed in the circuit formation region.

Here, the sixth layer corresponds to the layer where a semi-global interconnecting is formed. In addition, in the semi-global process for forming a semi-global interconnecting, semi-global interconnectings are laid out in dimensions that are, for example, two interconnectings as large as those in the process (fine process) for forming local interconnectings in the first to fifth layers. Therefore, the dummy vias 165 are formed so as to have a diameter of 0.28 μm, as shown in FIG. 9, and are laid out in a matrix alignment with a pitch of, for example, 2 μm.

Next, a 500 nm plasma SiN film is deposited on the interlayer insulating film 163 so as to form a first passivation film 173. After that, a hole 174 is formed in the first passivation film 173. Furthermore, after an Al layered film which includes a barrier metal of TiN/Ti has been deposited, patterning is carried out so as to form an Al interconnecting layer 171. Furthermore, a second passivation film 183 is formed after a 500 nm plasma SiN film has been deposited. Thus, the structure shown in FIG. 1 can be formed.

As described above, dummy vias are formed on the dicing region side in the semiconductor device according to this embodiment. Therefore, even in the case where cracking occurs at the time of dicing, the cracks are prevented from spreading by the dummy vias, and thus, cracking can be prevented from reaching the seal ring 190. Cracking can be prevented from reaching the seal ring 190 and the circuit formation region beyond the seal ring 190, and therefore, resistance to moisture absorbed in the circuit formation region can be increased, and deterioration in reliability can be prevented.

In addition, in the case where a low-k film is used in a portion where the Cu pattern ratio is low, such as a region where a seal ring is formed, the area occupied by the low-k film is increased. Adhesion between the low-k film and the diffusion prevention film is not high, and therefore, a problem arises where delamination (peeling of the film) easily occurs.

In this embodiment, the area occupied by the low-k film can be reduced through the formation of dummy vias. Therefore, even in the case where a low-k film is used, peeling of the film can be prevented.

Here, though in this embodiment, a case where a plasma SiOC film which is a low-k film is used as the interlayer insulating film is described, the same effects can be produced with a ULK (Ultra Low-k) film or a layered film having the same.

In addition, though a case is described where the diffusion prevention films 122, 132, 142, 152 and 162 are plasma SiC films, they may be plasma SiC films (k: 3 to 4) having a lower dielectric constant, plasma SiN films or layered films having these. In addition, the same effects can be produced even in the case where no diffusion prevention film is formed.

Furthermore, though a case is described where the dummy vias and the slit vias are formed of Cu, they may be made of W, TaN, TiN, Ta, Ti or layered films of these.

Though in this embodiment, a case is described where the dummy vias are vias with a pitch of 1 μm and have a diameter of 0.14 μm, the same effects can be produced when the diameter of the vias ranges from approximately 1 to 100 times as large as the minimum dimension. In addition, the pitch of the vias may be in a range where the occupation ratio thereof is from 0.01% to 20%.

Here, minimum dimension means a dimension defined as the diameter of vias and the width of interconnectings that are designed as vias and interconnectings formed in the respective layers.

In addition, though the dummy vias are shown to be in square form, the form may be rectangular, as long as it has an opening ratio at approximately the same level.

Though in this embodiment, a process for forming the dummy vias simultaneously with the vias in the circuit formation region is shown, the dummy vias may be formed before or after the vias in the circuit formation region. Furthermore, they may be formed separately from the slit vias for the seal ring 190. In addition, though a case is described where layers having the same layout are respectively layered, the same effects can be produced even in the case where the layout for the upper layer is shifted by half of the pitch from the layout for the lower layer. In addition, the layout in terms of the via diameter and the pitch may be different for each layer.

Second Embodiment

Figure 10:
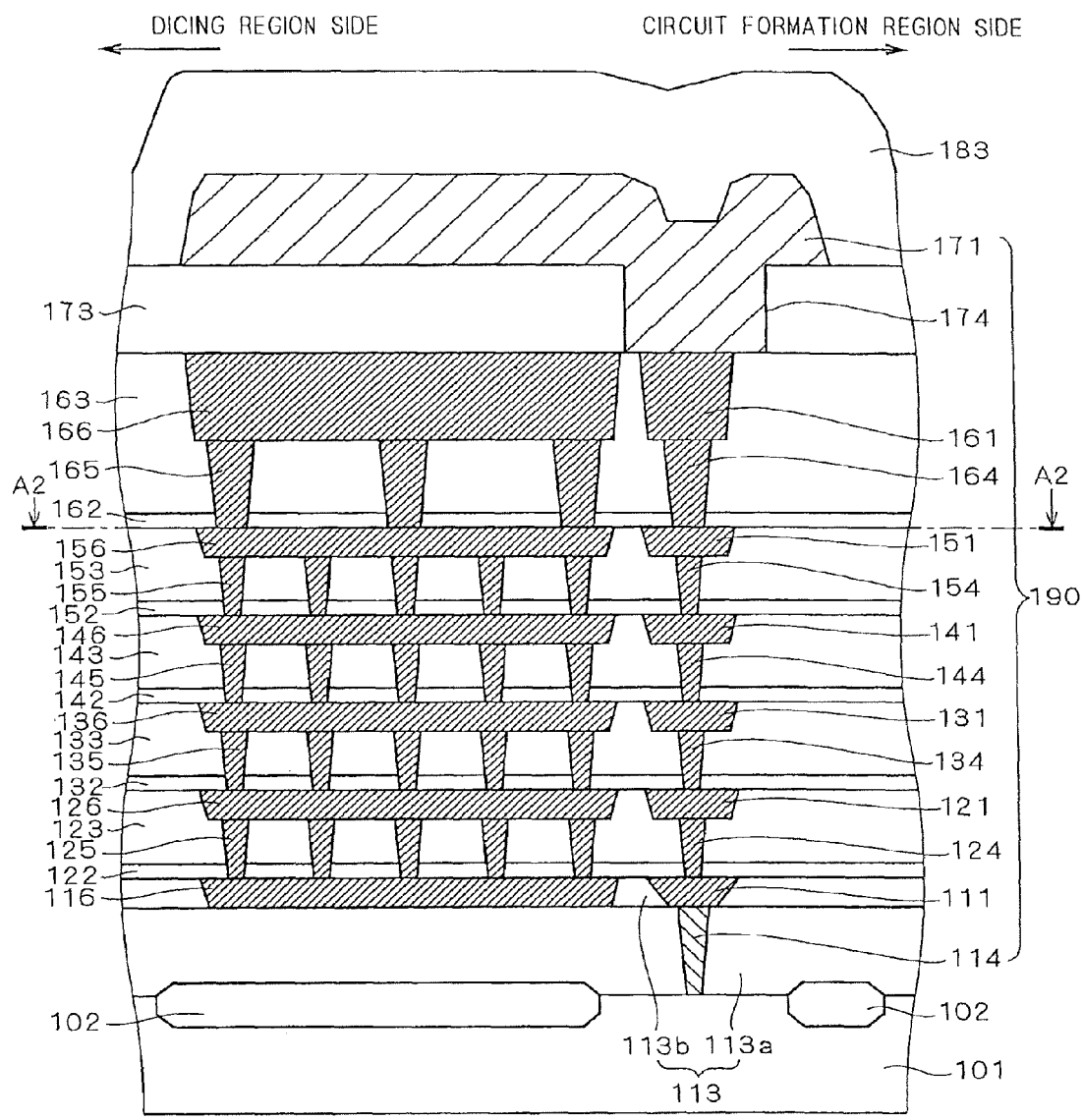
FIG. 10 is a sectional view showing a configuration of a semiconductor device according to a second embodiment.
Figure 11:
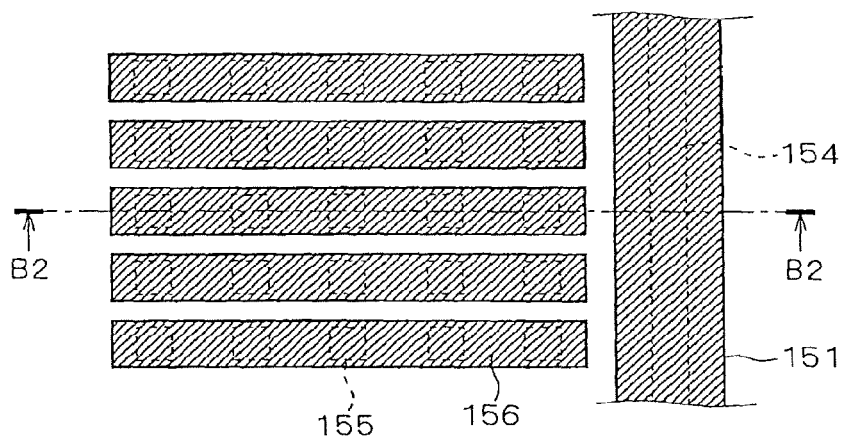
FIG. 11 is a top view showing the configuration of the semiconductor device according to the second embodiment.

FIG. 10 shows a configuration of a semiconductor device according to a second embodiment, which is an enlarged sectional view of a region where a seal ring is formed. FIG. 11 is a top view of the semiconductor device as viewed along line A2-A2 of FIG. 10. In addition, FIG. 10 is a sectional view of the semiconductor device taken along line B2-B2 of FIG. 11. In this embodiment, dummy metals and interconnecting layers are additionally formed in each layer. In the following description, the same symbols are attached to components that are the same as those in the first embodiment, and the description thereof is omitted.

A dummy metal 116 is formed in the same plane as an interconnecting layer 111. In addition, dummy vias 125 are formed on the dummy metal 116. A dummy metal 126 is formed on the dummy vias 125. Dummy metals 136, 146, 156 and 166 are formed on dummy vias 135, 145, 155 and 165, respectively. In addition, interconnecting layers 121, 131, 141, 151 and 161 are formed on slit vias 124, 134, 144, 154 and 164, respectively.

In addition, as shown in FIG. 11, a plurality of dummy metals 156 are placed parallel to each other so as to cover the top ends of the dummy vias 155. The dummy metals which are formed in other layers are placed in the same manner. Here, the lines of the dummy metals should be formed so as to have a width of no less than 10 μm, in order to prevent dishing that might occur in a CMP process after the deposition of Cu, and the width may be, for example, 2 μm. In addition, the interconnecting layer 151 is formed on the slit via 154.

The dummy metals 116, 126, 136, 146, 156 and 166, as well as the interconnecting layers 111, 121, 131, 141 and 151 are made of a barrier metal having a Ta/TaN structure in which Cu is buried.

Here, the W plug 114, the interconnecting layers 111, 121, 131, 141, 151 and 161, the slit vias 124, 134, 144, 154 and 164, as well as an Al interconnecting layer 171, form a seal ring 190.

In the following, a manufacturing method for the semiconductor device according to this embodiment will be described with reference to FIGS. 12 to 18. First, as described in the first embodiment (FIG. 3), a trench isolation film 102, an interlayer insulating film 113 and a W plug 114 are formed on a silicon substrate 101.

Figure 12:
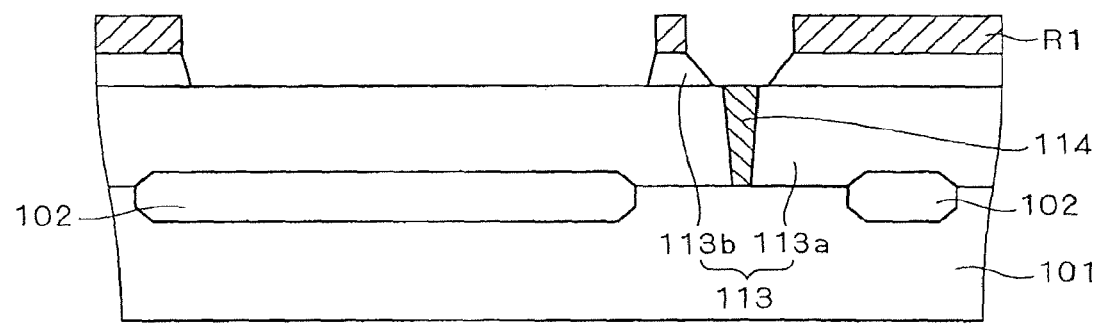
FIG. 12 illustrates a manufacturing process for the semiconductor device according to the second embodiment.

Next, in the process shown in FIG. 12, 300 nm of a plasma TEOS film is deposited. Then, the plasma TEOS film is etched using a resist mask R1 so as to form openings that correspond to the dummy metal 116 and the interconnecting layer 111.

Figure 13:
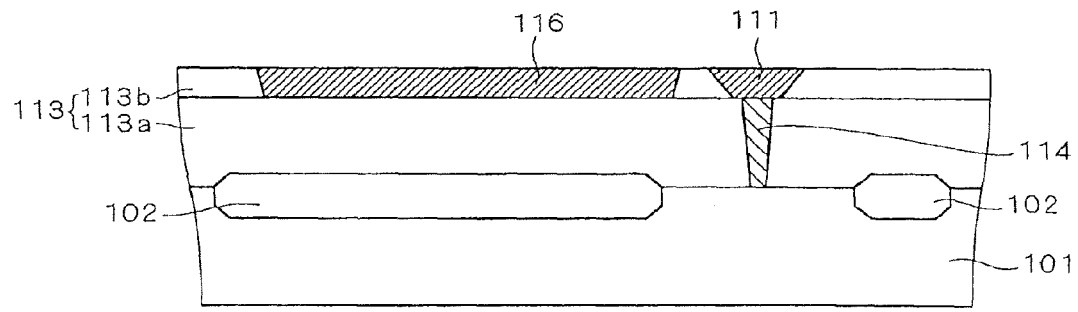
FIG. 13 illustrates a manufacturing process for the semiconductor device according to the second embodiment.

Subsequently, in the process shown in FIG. 13, a barrier metal (not shown) is formed by respectively forming 10 nm films of TaN and Ta in accordance with a sputtering method after the resist mask R1 has been removed, and then, 100 nm of Cu is deposited in accordance with a sputtering method, so as to form a seed (not shown). In addition, 1000 nm of Cu, which is the material of the interconnecting layer 111, is deposited in accordance with a plating method. Then, Cu and the barrier metal on the interlayer insulating film 103 are removed in accordance with a CMP method, and thereby, the interconnecting layer 111 and the dummy metal 116 are formed.

Figure 14:
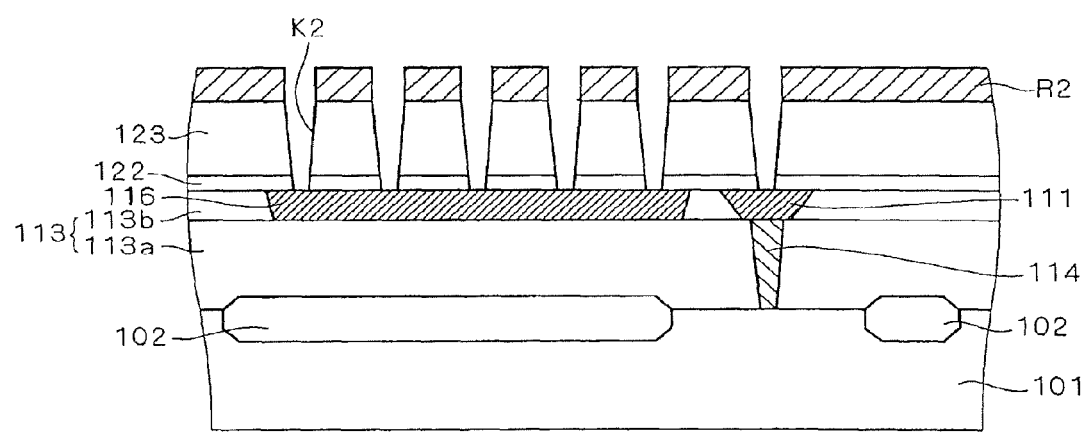
FIG. 14 illustrates a manufacturing process for the semiconductor device according to the second embodiment.

Next, 50 nm of a plasma SiC film is deposited, and thereby, a diffusion prevention film 122 is formed. Subsequently, 600 nm of a plasma SiOC film, for example, is deposited and 200 nm thereof is polished off in accordance with a CMP method, and thereby, an interlayer insulating film 123 is formed. After that, openings K2 in which the dummy vias 125 and the slit via 124 are to be formed are formed in the interlayer insulating film 123 through dry etching using a resist mask R2 (FIG. 14).

At this time, openings (not shown) in which second vias are to be formed are formed simultaneously with the openings K2 for the dummy vias 125 and the slit via 124 in the circuit formation region, not shown here.

Subsequently, in the process shown in FIG. 15, the interlayer insulating film 123 is etched using a resist mask R3, and thereby, openings in which the dummy metal 126 and the interconnecting layer 121 are to be formed are formed. At this time, openings (not shown) in which second interconnecting layers are to be formed are formed in the circuit formation region, not shown.

Next, in the process shown in FIG. 16, 10 nm of Ta and TaN are respectively deposited in accordance with a sputtering method after the resist mask R3 has been removed. Then, 100 nm of Cu is deposited in accordance with a sputtering method, and thereby, a seed is formed (not shown). After that, 1000 nm of Cu is deposited in accordance with a plating method, and Cu and the barrier metal on the interlayer insulating film 123 are removed in accordance with a CMP method. Thus, the dummy vias 125, the slit via 124, the dummy metals 125 and the interconnecting layer 121 are simultaneously formed. In addition, the second vias and the second interconnecting layers, not shown, are simultaneously formed in the circuit formation region.

Figure 17:
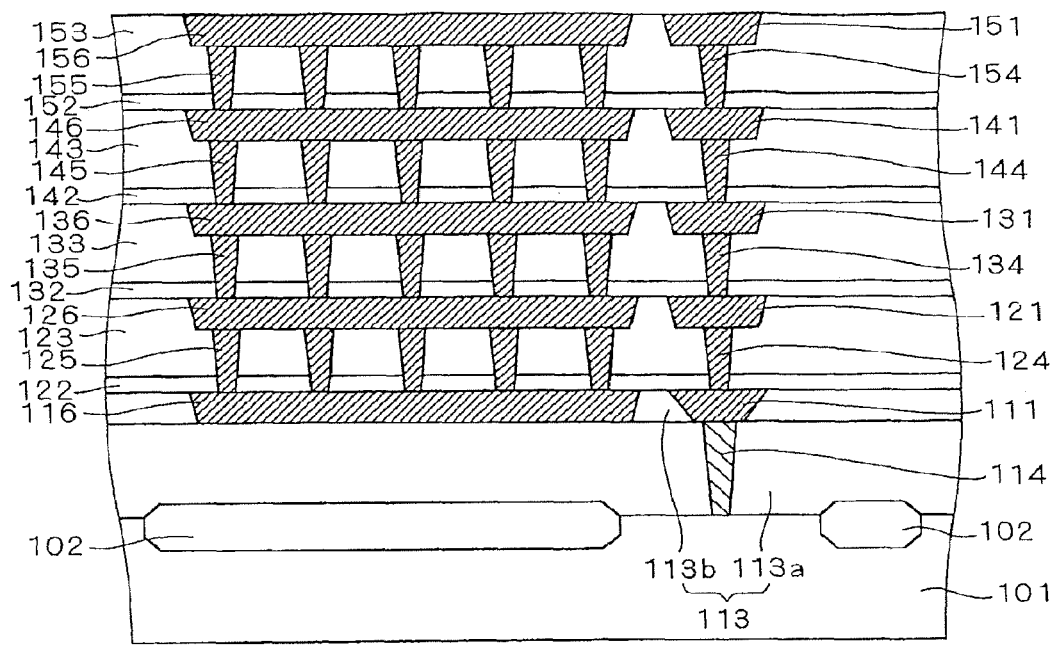
FIG. 17 illustrates a manufacturing process for the semiconductor device according to the second embodiment.

In accordance with the same procedure, dummy vias 135, 145 and 155, slit vias 134, 144 and 154, dummy metals 136, 146 and 156, as well as interconnecting layers 131, 141 and 151, are formed in the third to fifth layers (FIG. 17). The third to fifth vias and the third to fifth interconnecting layers are simultaneously formed in the circuit formation region. The formation method is the same as that for the second layer, and the description thereof is omitted.

Figure 18:
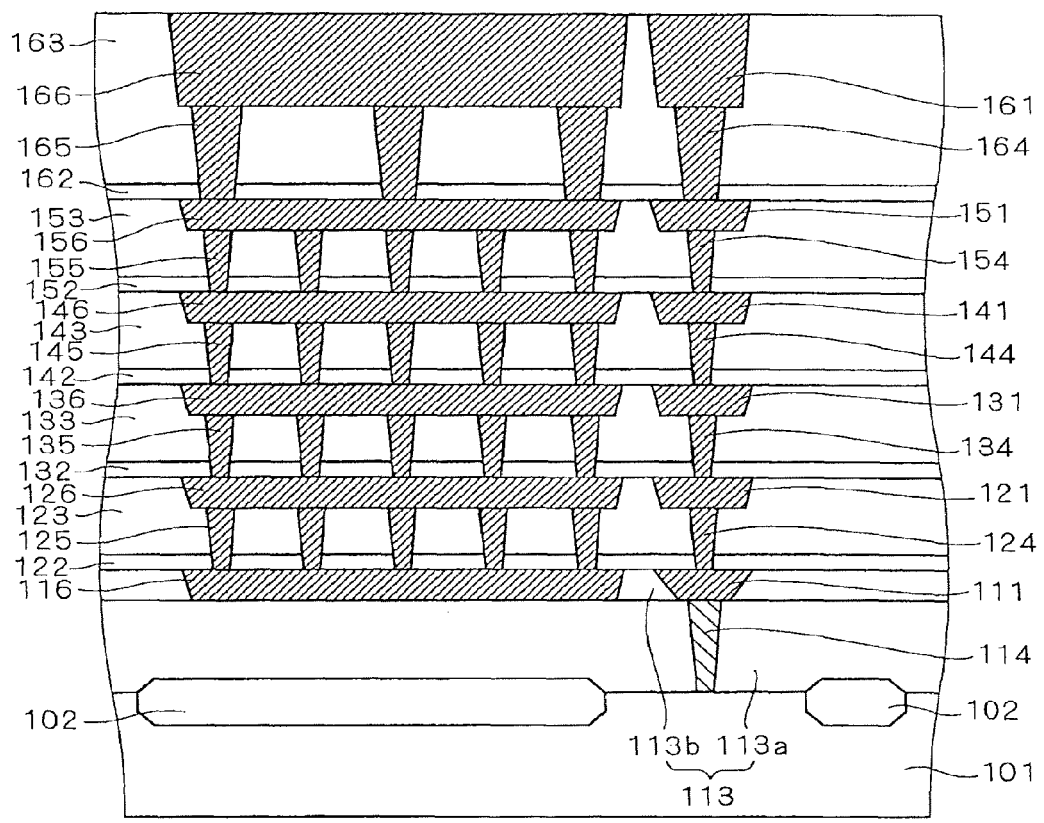
FIG. 18 illustrates a manufacturing process for the semiconductor device according to the second embodiment.

Next, in the process shown in FIG. 18, 50 nm of a plasma SiC film, for example, is deposited, and thereby, a diffusion prevention film 162 is formed. Subsequently, 1200 nm of a plasma TEOS film, for example, is deposited and 200 nm thereof is polished off in accordance with a CMP method, and thereby, an interlayer insulating film 163 is formed.

Then, in accordance with the same procedure as that in the descriptions of FIGS. 14 and 15, a slit via 164, dummy vias 165, a dummy metal 166 and an interconnecting layer 161 are formed in interlayer insulating film 163. At the same time, sixth vias and sixth interconnecting layers are formed in the circuit formation region.

Herein, the sixth layer corresponds to the layer where semi-global interconnectings are formed. In addition, the semi-global process for forming the semi-global interconnectings is designed for a layout of which the dimensions are two times as large as in the process (fine process) for forming local interconnectings in the first to fifth layers. Accordingly, dummy vias 165 are formed so as to have a diameter of 0.28 μm, as shown in FIG. 18, and are laid out in a matrix alignment with a pitch of, for example, 2 μm.

Next, a first passivation film 173 is formed by depositing 500 nm of a plasma SiN film on the interlayer insulating film 163. After that, a hole 174 is formed in the first passivation film 173. Furthermore, patterning is carried out so as to form an Al interconnecting layer 171 after the deposition of an Al layered film that includes a barrier metal of TiN/Ti. In addition, a second passivation film 183 is formed after the deposition of 500 nm of a plasma SiN film. Thus, the structure shown in FIG. 10 can be formed.

In this embodiment, dummy metals are formed in the respective layers. Therefore, cracking that occurs at the time of dicing can further be prevented from spreading. The seal ring 190 can be prevented from being exposed through cracking and the like, and therefore, moisture absorption of the circuit formation region can be improved.

In addition, there is a difference in the coefficient of thermal expansion between the low-k film and the diffusion prevention film. Therefore, there is stress between the low-k film and the diffusion prevention film. In this embodiment, dummy metals are provided, and thereby, the area where the low-k film makes contact with the diffusion prevention film is reduced. As a result, stress between the low-k film and the diffusion prevention film can be released.

Furthermore, the area where the dummy metals make contact with the diffusion prevention film that has been provided in the upper layer is increased, as a result of the dummy metals. Adhesion between the dummy metals and the diffusion prevention film is strong, in comparison with the adhesion between the low-k film and the diffusion prevention film, and therefore, adhesion between the respective layers can be enhanced by increasing the area of the dummy metals.

In addition, in the case where interconnectings having a large width are used for the dummy metals and the interconnecting layers, a problem arises where the dummy metals and the interconnecting layers may be disconnected due to dishing during the CMP process after Cu has been buried.

Furthermore, in the case where interconnectings having a large width are used, a problem arises where voids (SIV: Stress Induced Voids) occur in junction portions between dummy vias in an upper layer and dummy metals in the lower layer (for example, junction portions between the dummy vias 125 and the dummy metal 116) after having been stored at a high temperature (SM test: Stress Migration test), reducing the reliability. In this embodiment, no interconnectings having a large width are used for the dummy metals and the interconnecting layers in the layout, and therefore, such problems can be prevented.

Third Embodiment

Figure 19:
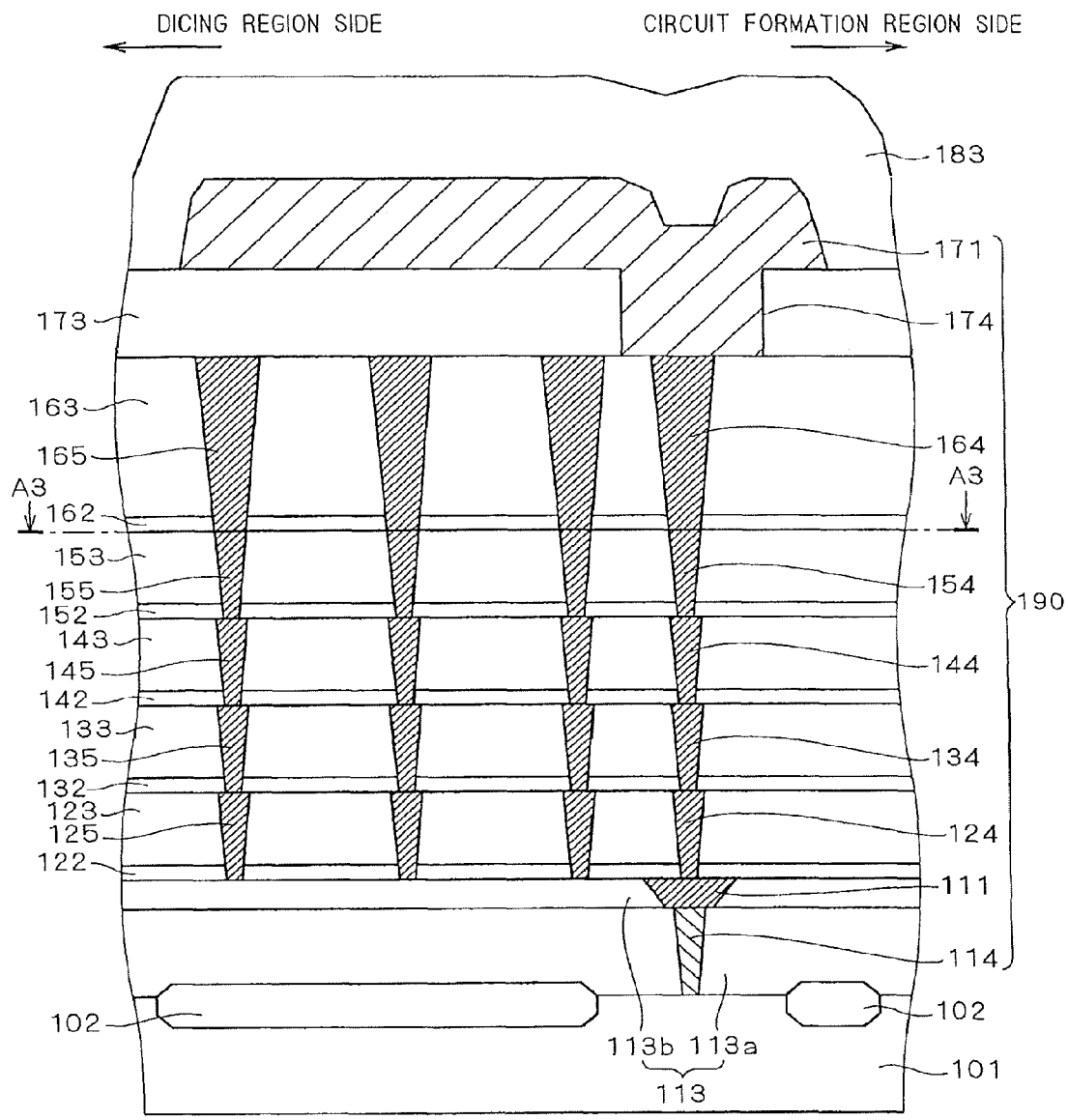
FIG. 19 is a sectional view showing a configuration of a semiconductor device according to a third embodiment.

FIG. 19 shows a configuration of a semiconductor device according to a third embodiment, which is an enlarged sectional view of a region where a seal ring is formed. FIG. 20 is a top view of the semiconductor device as viewed along line A3-A3 of FIG. 19. In addition, FIG. 19 is a sectional view of the semiconductor device taken along line B3-B3 of FIG. 20. The same symbols are attached to components that are the same as those in the first embodiment, and the description thereof is omitted.

In the semiconductor device according to this embodiment, dummy vias 155 are arranged in such a manner that they are aligned in zigzag pattern, as shown in the top view of FIG. 20. Namely, dummy vias formed in adjacent columns are shifted by half a pitch from each other. In other words, the dummy vias 155 are arranged along a plurality of columns in a plan view, and the dummy vias 155 which are arranged in adjacent columns are alternately arranged so as to be aligned in zigzag pattern. The dummy vias that are formed in other layers are aligned in the same manner. The manufacturing method is the same as that of the first embodiment, and the description thereof is omitted.

The semiconductor device has the above-mentioned configuration, and therefore, the same effects are produced as those of the first embodiment. In addition, in the first embodiment, dummy vias are aligned at the same intervals in a matrix, and therefore, there is a possibility that cracking might spread between the dummy vias and reach the seal ring. In this embodiment, the dummy vias are arranged in zigzag form as viewed from above, and therefore, the possibility of cracking spreading between the dummy vias becomes low. As a result, spreading of the cracking that occurs at the time of dicing can further be restricted.

Fourth Embodiment

Figure 21:
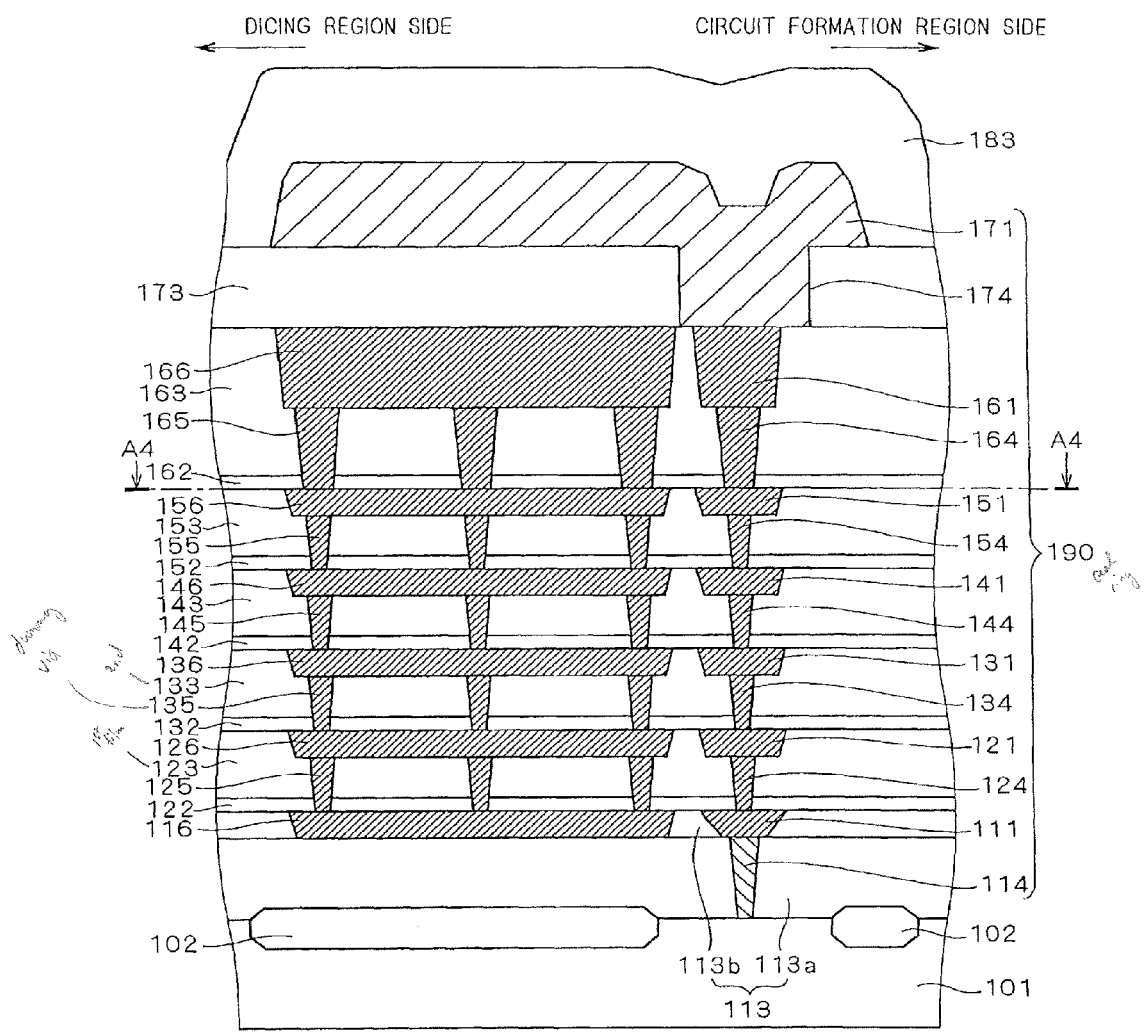
FIG. 21 is a sectional view showing a configuration of a semiconductor device according to a fourth embodiment.

FIG. 21 shows a configuration of a semiconductor device according to a fourth embodiment, which is an enlarged sectional view of a region where a seal ring is formed. The fourth embodiment is gained by combining the second and third embodiments, and the same symbols are attached to components that are the same as those in the second and third embodiments, and the description thereof is omitted.

Figure 22:
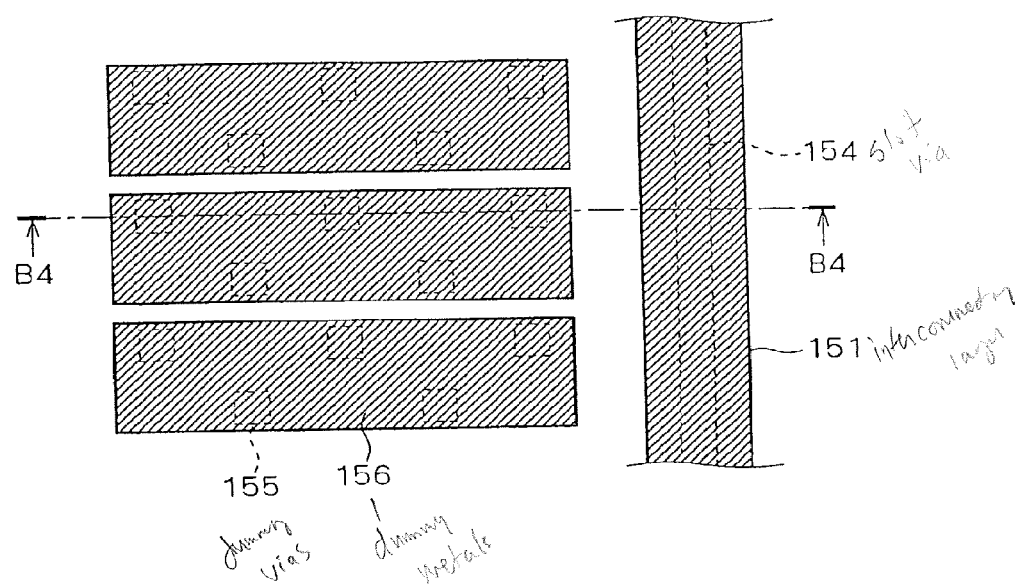
FIG. 22 is a top view showing the configuration of the semiconductor device according to the fourth embodiment.

FIG. 22 is a top view of the semiconductor device as viewed along line A4-A4 of FIG. 21, and FIG. 21 is a sectional view of the semiconductor device taken along line B4-B4 of FIG. 22. As shown in FIG. 22, dummy vias 155 are arranged in such a manner that they are aligned in zigzag pattern. Namely, the dummy vias 155 which are formed in adjacent columns are shifted by half a pitch from each other. Furthermore, a dummy metal 156 is formed over the dummy vias 155. Other layers are formed in the same manner. In addition, the manufacturing method is the same as that of the second embodiment, and the description thereof is omitted.

As described above, in this embodiment, dummy vias are arranged in zigzag form, and a dummy metal is formed in each layer. In addition, the dummy metal is placed so as to cover the dummy vias. As a result, spreading of the cracking that occurs at the time of dicing can further be restricted. In addition, the formation of the dummy metals relieves stress between the low-k films and the diffusion prevention films, and adhesion between these films can be enhanced.

Fifth Embodiment

Figure 23:
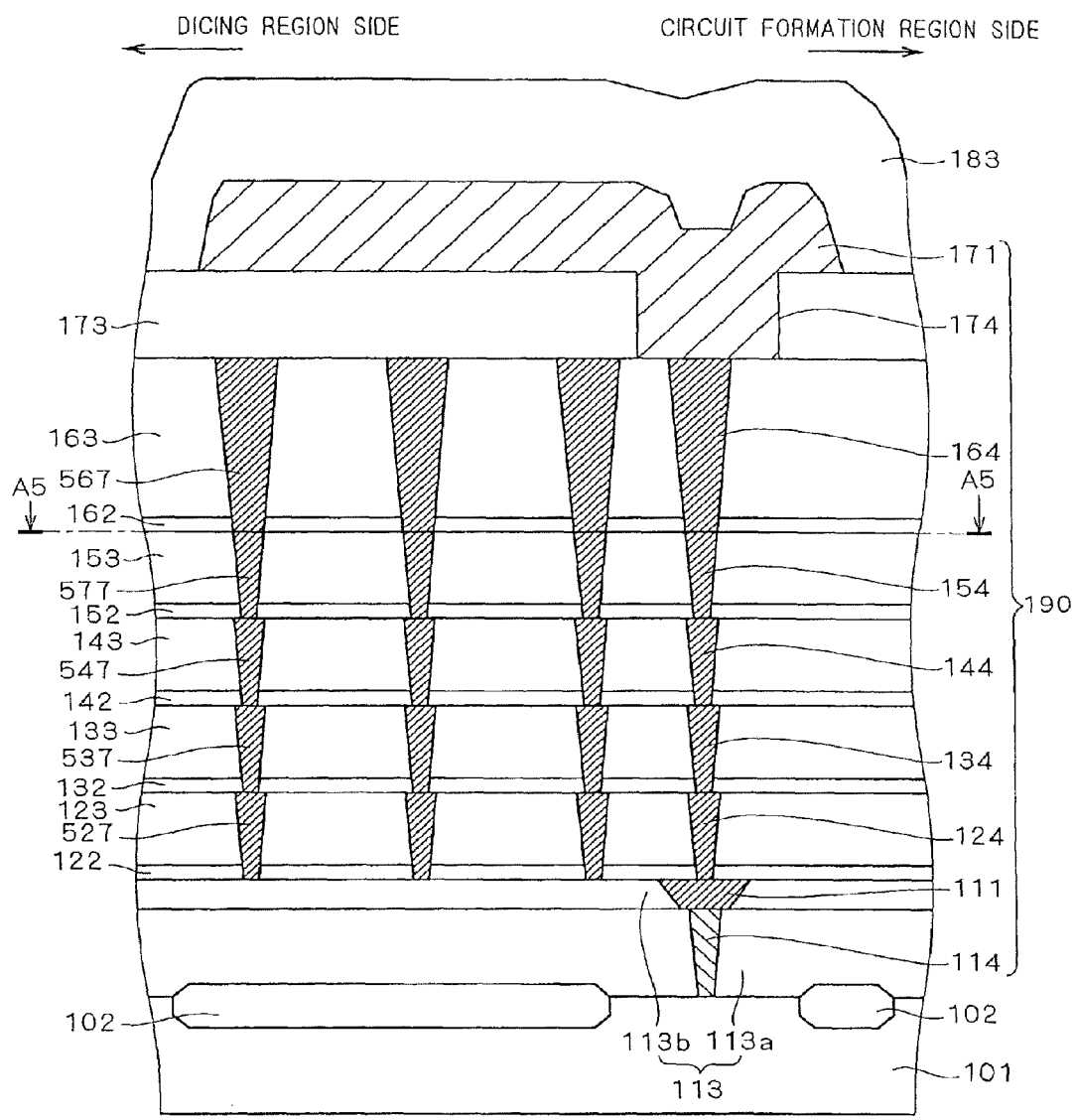
FIG. 23 is a sectional view showing a configuration of a semiconductor device according to a fifth embodiment.

FIG. 23 shows a configuration of a semiconductor device according to a fifth embodiment, which is an enlarged sectional view of a region where a seal ring is formed. FIG. 24 is a top view of the semiconductor device as viewed along line A5-A5 of FIG. 23, and FIG. 23 is a sectional view of the semiconductor device taken along line B5-B5 of FIG. 24.

In this embodiment, as shown in FIG. 24, dummy slit vias 557 are formed instead of the dummy vias 155. The dummy slit vias 557, in their minimum dimensions, are formed so as to have a slit width of, for example, 0.14 µm. Each of the second to fourth layers has the same configuration, and dummy slit vias 527, 537 and 547 are formed. Dummy slit vias 567 in the sixth layer are formed so as to have a slit width of 0.28 µm.

The other parts of the configuration are the same as those in the first embodiment and the same symbols are attached to components that are the same, and the description thereof is omitted. The manufacturing method is the same as that of the first embodiment, except that dummy slit vias are formed instead of dummy vias, and the description thereof is omitted.

As described above, dummy slit vias are formed instead of dummy vias on the dicing region side according to this embodiment. Dummy slit vias are formed on the dicing region side, and thereby, spreading of cracking that occurs at the time of dicing can be restricted more efficiently than the case where dummy vias are formed. Spreading of cracking to the seal ring 190 can be prevented by placing dummy slits, and therefore, resistance to moisture absorbed in the circuit formation region can be increased.

Furthermore, the dummy slit vias which have the structure in slit form can reduce the area occupied by the low-k film, in comparison with the dummy vias. Therefore, stress between the low-k film and the diffusion prevention film can be relieved.

In addition, the area where the low-k film and the diffusion prevention film make contact with each other is reduced by providing the dummy slit vias, and therefore, adhesion between these films can be enhanced.

Sixth Embodiment

Figure 26:
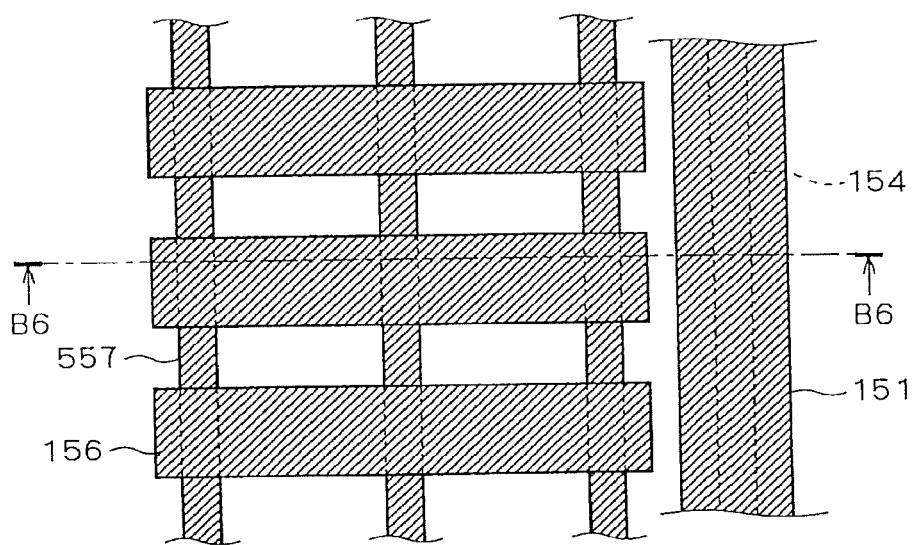
FIG. 26 is a top view showing the configuration of the semiconductor device according to the sixth embodiment.

FIG. 25 shows a configuration of a semiconductor device according to a sixth embodiment, which is an enlarged sectional view of a region where a seal ring is formed. FIG. 26 is a top view of the semiconductor device as viewed along line A6-A6 of FIG. 25, and FIG. 25 is a sectional view of the semiconductor device taken along line B6-B6 of FIG. 26.

The sixth embodiment is gained by combining the second and fifth embodiments, and the same symbols are attached to components that are the same as those in the second and fifth embodiments, and the description thereof is omitted.

In this embodiment, dummy metals are further formed in each layer of the first to sixth layers, in addition to the dummy slit vias.

As shown in FIG. 26, dummy metals 156 which are formed in, the fifth layer, are formed at the same intervals, so as to cross over dummy slit vias 557 at right angles. Dummy slit vias 527, 537, 547 and 567, as well as dummy metals 126, 136, 146, 156 and 166, are formed in the second to fourth layers and sixth layer in the same manner. In the first layer, only dummy metals 116 are formed.

Here, the manufacturing method is the same as the manufacturing method shown in the second embodiment, and therefore, the detailed description thereof is omitted.

Dummy metals are formed over dummy slits, and thereby, spreading of cracking that occurs at the time of dicing can be efficiently restricted, in comparison with a configuration which has only dummy slit vias.

In addition, dummy metals are formed in addition to dummy slit vias, and thereby, the area occupied by the low-k film is reduced, so that stress between the low-k film and the diffusion prevention film can be relieved, and adhesion between these films can be enhanced.

Seventh Embodiment

FIG. 27 shows a configuration of a semiconductor device according to a seventh embodiment, which is an enlarged sectional view of a region where a seal ring is formed. FIG. 28 is a top view of the semiconductor device as viewed along line A7-A7 of FIG. 27, and FIG. 27 is a sectional view of the semiconductor device taken along line B7-B7 of FIG. 28.

In this embodiment, as shown in FIG. 28, dummy slit vias 557 are formed so as to have thick line widths. The other parts of the configuration are the same as those in the fifth embodiment, and the same symbols are attached to components that are the same, and the description thereof is omitted.

The dummy slit vias are formed so as to have a line width of, for example, 1 μm. Dummy slit vias 527, 537 and 547 are formed in the second to fourth layers so as to have the same thick line width. In the sixth layer, dummy slit vias 567 are formed so as to have a line width of, for example, 2 μm.

Here, the manufacturing method is the same as the manufacturing method shown in the first embodiment, except that dummy slit vias are formed instead of dummy vias, and the description thereof is omitted.

As described above, a thick width dummy slit via structure where the line widths have been increased is used, and thereby, spreading of cracking that occurs at the time of dicing can be efficiently restricted, in comparison with the case where the line width is small.

In addition, the area occupied by the low-k film is reduced by forming dummy slit vias with a great width. Therefore, stress between the low-k film and the diffusion prevention film can be relieved.

Furthermore, the area where the dummy slit vias and the diffusion prevention film that is formed in the upper layer make contact with each other becomes great, in comparison with the case where dummy slit vias having a small width are used, and therefore, adhesion between the dummy slit vias and the diffusion prevention film can be enhanced.

Here, the line width of the dummy slit vias is not limited to 1 μm, and the same effects can be produced in the case where the line width is 0.8 μm to 2 μm. In general, the same effects can be produced in the case where the dummy slit vias are formed so as to have a line width that is 5 to 20 times greater than the minimum dimensions that are defined by the diameter of vias or the width of interconnectings for designing vias and interconnectings that are formed in each layer. However, it is necessary to optimize the conditions for the manufacturing process, for example, the etching conditions and the film thickness of Cu plating for filling in dummy slit vias, on the basis of the line width.

Eighth Embodiment

Figure 29:
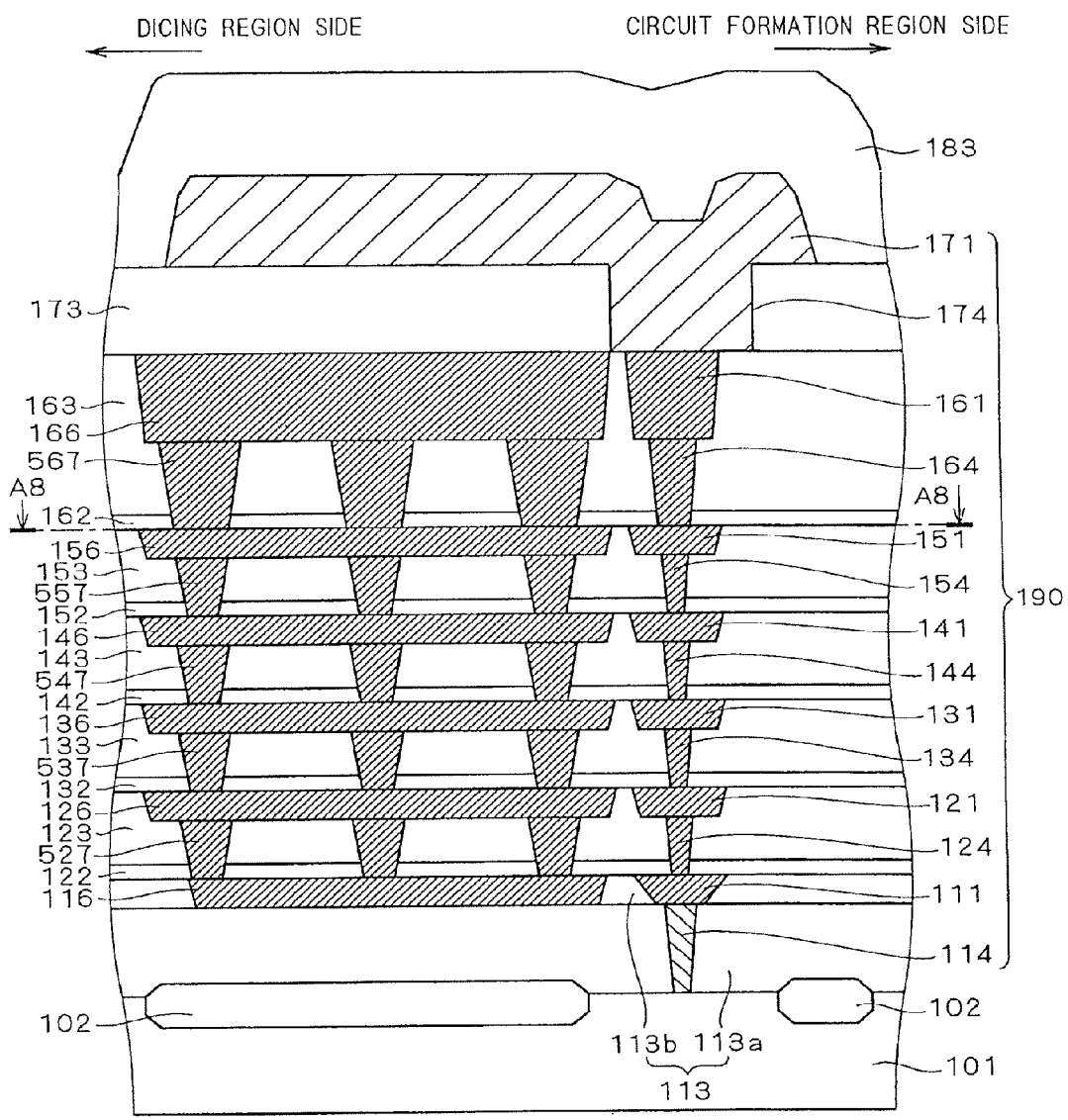
FIG. 29 is a sectional view showing a configuration of a semiconductor device according to an eighth embodiment.
Figure 30:
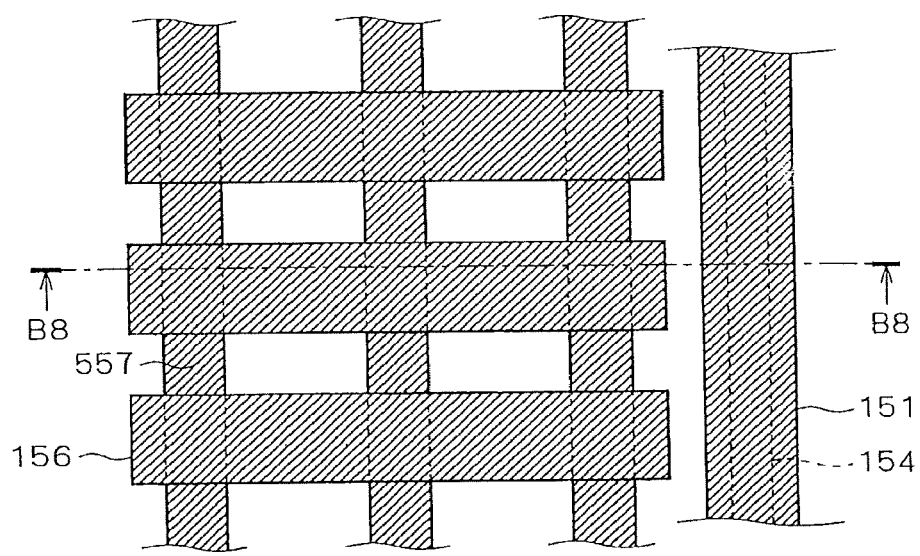
FIG. 30 is a top view showing the configuration of the semiconductor device according to the eighth embodiment.

FIG. 29 shows a configuration of a semiconductor device according to an eighth embodiment, which is an enlarged sectional view of a region where a seal ring is formed. FIG. 30 is a top view of the semiconductor device along line A8-A8 of FIG. 29 and FIG. 29 is a sectional view of the semiconductor device taken along line B8-B8 of FIG. 30.

This embodiment is gained by thickening the line width of the dummy slit vias in the sixth embodiment. The dummy slit vias are formed so as to have a line width of, for example, 1 μm. The other parts of the configuration are the same as those in the sixth embodiment, and the same symbols are attached to the same components and the description thereof is omitted.

As described above, dummy metals are formed in the respective layers, and in addition, a thick width dummy slit via structure having a thick line width is used, and thereby, spreading of cracking that occurs at the time of dicing can be efficiently restricted in comparison with the case where the line width is thin.

In addition, the area occupied the low-k film is reduced, and thereby, stress between the low-k film and the diffusion prevention film can be relieved.

Furthermore, the area where the low-k film and the diffusion prevention film make contact with each other becomes smaller than in the case where dummy slit vias having a smaller line width are formed, and therefore, adhesion between these films can be increased.

Here, the line width of the dummy slit vias is not limited to 1 μm, but rather the same effects can be produced in the case where the line width is 0.8 μm to 2 μm. In general, the same effects can be produced in the case where the dummy slit vias have a line width 5 to 20 times greater than the minimum dimensions that are defined by the diameter of vias or the width of interconnectings for designing vias and interconnectings that are formed in each layer. However, it is necessary to optimize the conditions for the manufacturing process, for example, the etching conditions and the film thickness of Cu plating for filling in dummy slit vias, on the basis of the line width.

Ninth Embodiment

Figure 31:
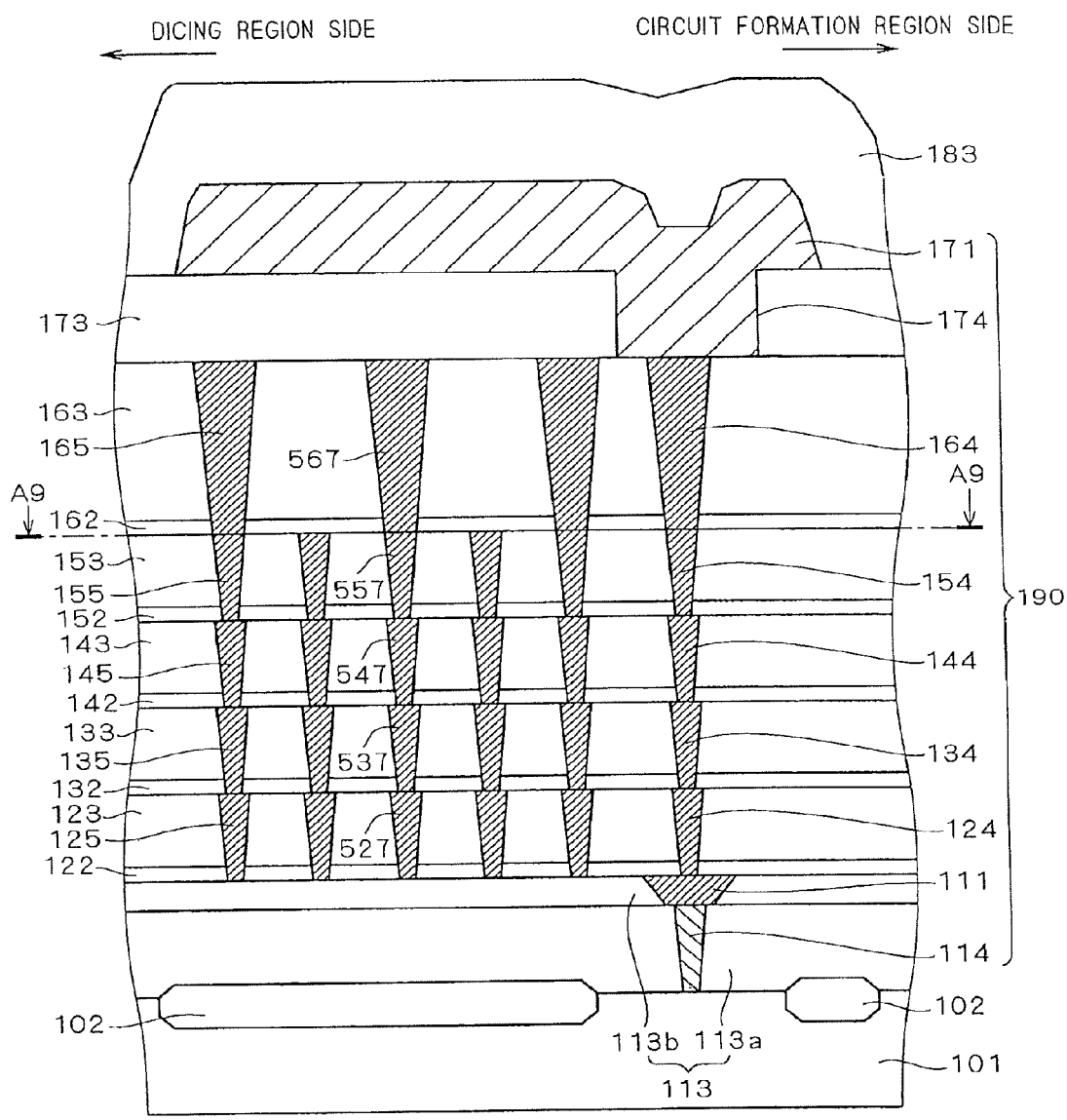
FIG. 31 is a sectional view showing a configuration of a semiconductor device according to a ninth embodiment.

FIG. 31 shows a configuration of a semiconductor device according to a ninth embodiment, which is an enlarged sectional view of a region where a seal ring is formed. FIG. 32 is a sectional view of the semiconductor device taken along line A9-A9 of FIG. 31 and FIG. 31 is a sectional view of the semiconductor device taken along line B9-B9 of FIG. 32.

The ninth embodiment is gained by combining the first and fifth embodiments, and the same symbols are attached to the same components as the first and fifth embodiments and the description thereof is omitted.

In this embodiment, dummy vias and dummy slit vias are formed in the respective layers from the second to sixth layers on the dicing region side.

As shown in FIG. 32, dummy vias 155 are formed at the same intervals in a matrix on both sides of a dummy slit via 557. The other layers have the same structure.

In the above-mentioned structure, spreading of cracking can be prevented by the dummy slit via even in the case where cracking that occurs at the time of dicing spreads between the dummy vias. Therefore, spreading of cracking can be reduced in comparison with the structure shown in the first embodiment.

In addition, a structure where dummy vias and a dummy slit via are combined is provided, and therefore, the area occupied by the low-k film can be reduced in comparison with the structure of the first embodiment that is provided with only dummy vias. Therefore, stress between the low-k film and the diffusion prevention film can be relieved.

Furthermore, the area where the low-k film and the diffusion prevention film make contact with each other is reduced and adhesion between these films can be increased.

Tenth Embodiment

Figure 33:
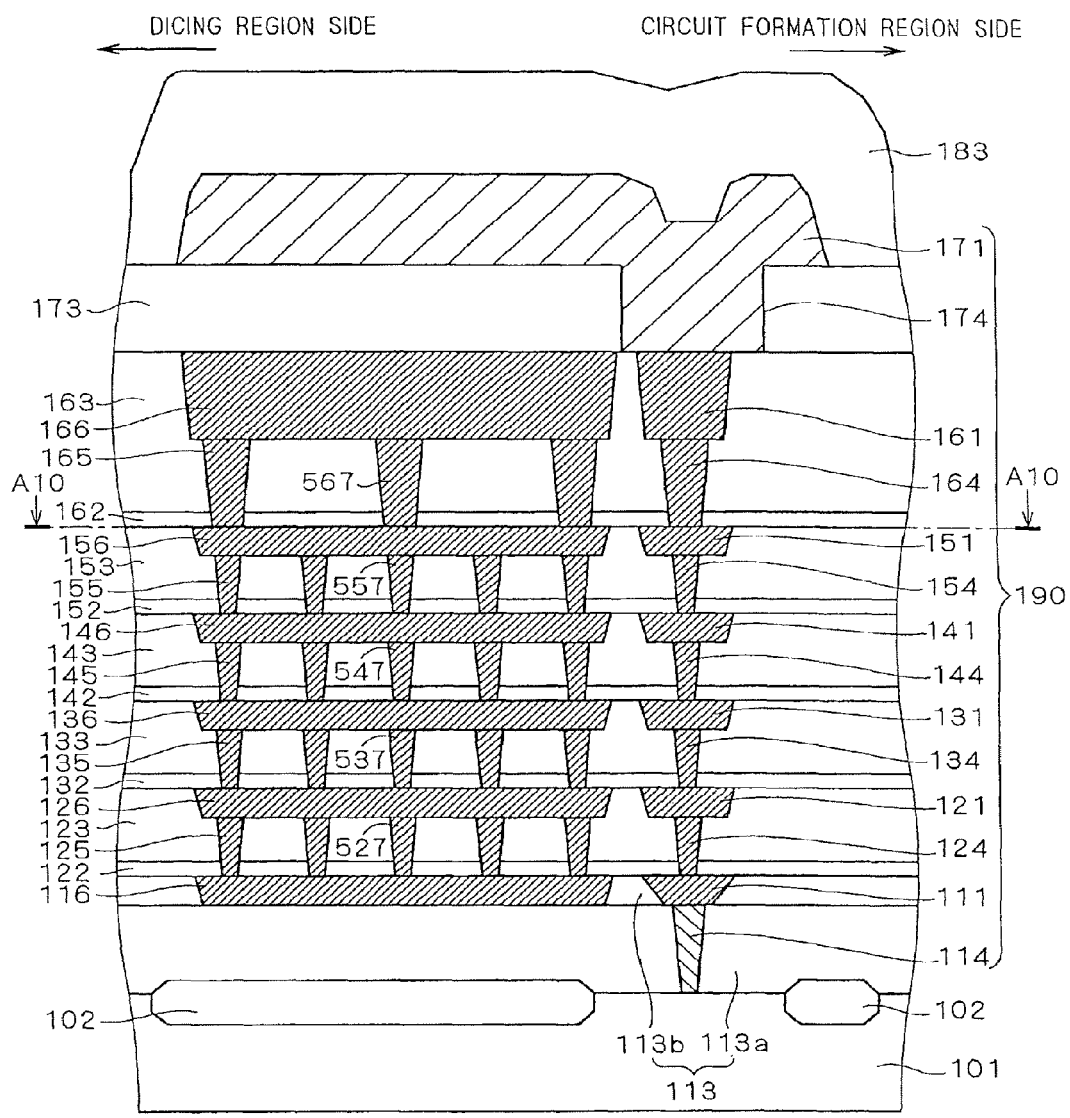
FIG. 33 is a sectional view showing a configuration of a semiconductor device according to a tenth embodiment.

FIG. 33 shows a configuration of a semiconductor device according to a tenth embodiment, which is an enlarged sectional view of a region where a seal ring is formed. FIG. 34 is a top view of the semiconductor device as viewed along line A10-A10 of FIG. 33 and FIG. 33 is a sectional view of the semiconductor device taken along line B10-B10 of FIG. 34.

The tenth embodiment is gained by combining the second and ninth embodiments, and the same symbols are attached to the same components as those in the second and ninth embodiments and the description thereof is omitted.

As shown is FIG. 33, dummy slit vias and dummy vias are formed on the dicing region side and dummy metals are formed in the respective layers from the first to sixth layers. In addition, as shown in FIG. 34, dummy vias 155 are formed at the same intervals in a matrix on both sides of a dummy slit via 557. In addition, a dummy metal 156 is formed so as to cover the dummy slit via 557 and the dummy vias 155. The second to fourth and sixth layers are respectively formed in the same manner.

Here, the manufacturing method is almost the same as that of the second embodiment and the description thereof is omitted.

Dummy metals are formed in the respective layers so as to cover the dummy slit vias and the dummy vias, and thereby, spreading of cracking that occurs at the time of dicing can further be restricted in comparison with the structure of the ninth embodiment.

In addition, the area where the low-k film makes contact with the diffusion prevention film is reduced by providing a dummy metal. As a result, stress between the low-k film and the diffusion prevention film can be relieved. Furthermore, adhesion between the respective layers can be enhanced.

Eleventh Embodiment

Figure 35:
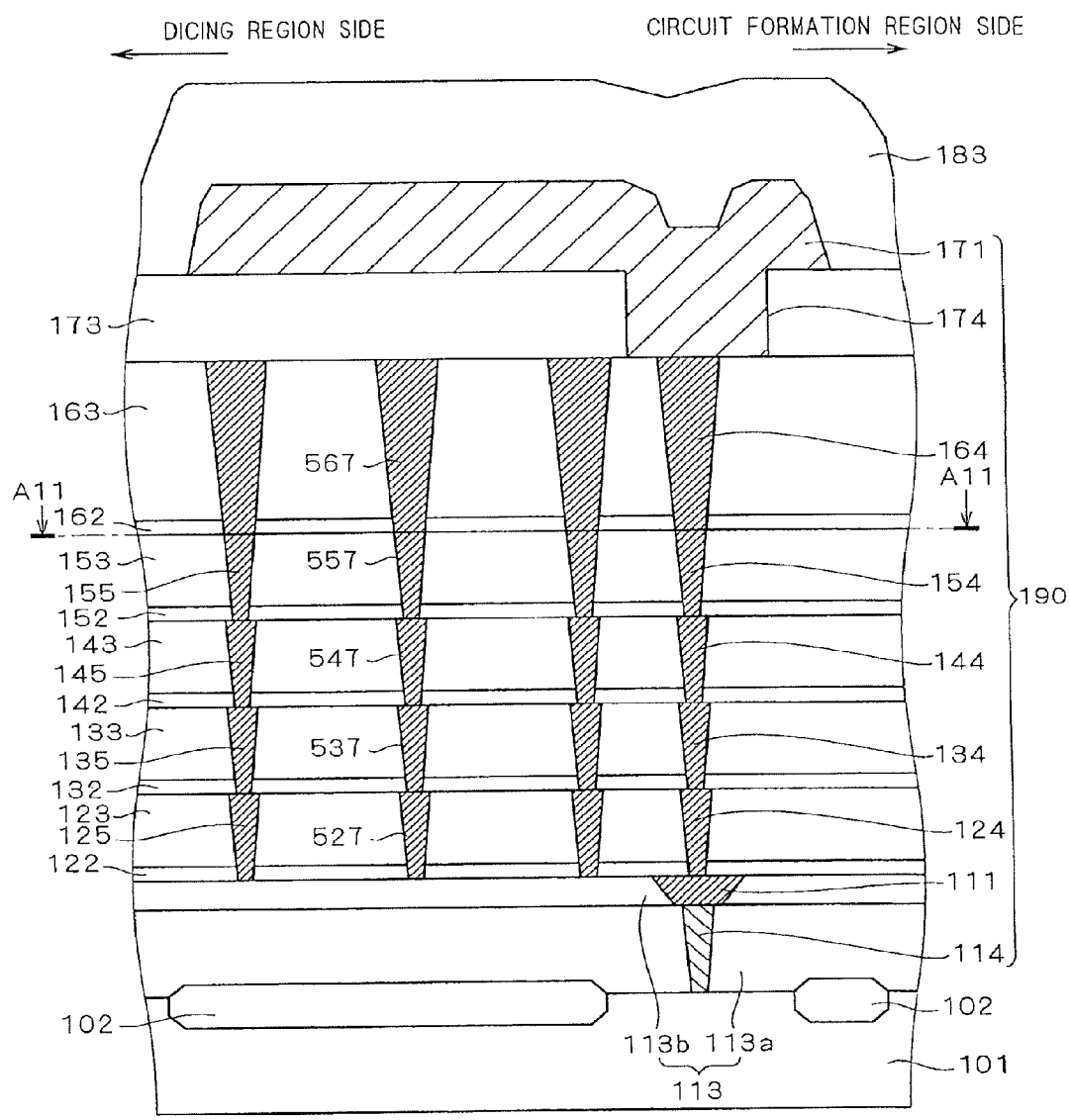
FIG. 35 is a sectional view showing a configuration of a semiconductor device according to an eleventh embodiment.
Figure 36:
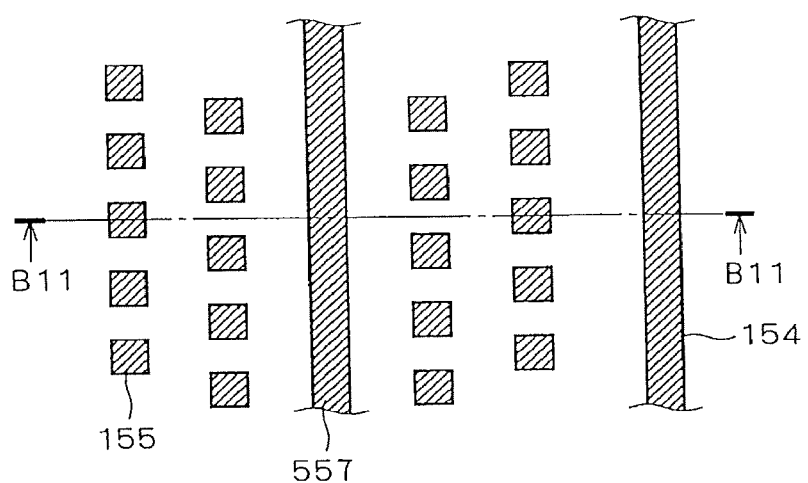
FIG. 36 is a top view showing the configuration of the semiconductor device according to the eleventh embodiment.

FIG. 35 shows a configuration of a semiconductor device according to an eleventh embodiment, which is an enlarged sectional view of a region where a seal ring is formed. FIG. 36 is a top view of the semiconductor device as viewed along line A11-A11 of FIG. 35, and FIG. 35 is a sectional view of the semiconductor device taken along line B11-B11 of FIG. 36.

In this embodiment, as shown in FIG. 36, dummy vias 155 are formed on both sides of a dummy slit via 557. In addition, dummy vias 155 are arranged in a zigzag manner. The other layers have the same configuration.

The other parts of the configuration are the same as those in the ninth embodiment, and the same symbols are attached to the same components and the description thereof is omitted. In addition, the manufacturing method is the same as the manufacturing method described in the first embodiment and the description thereof is omitted.

In this embodiment, dummy vias are arranged in a zigzag manner, and thereby, the amount of cracking that reaches the dummy slit via can be reduced. In addition, even in the case where cracking spreads beyond the dummy slit via, the amount of cracking that reaches the seal ring 190 can be reduced in comparison with the configuration of the ninth embodiment due to the additional formation of dummy vias which are arranged in a zigzag manner between the dummy slit and the seal ring 190.

Twelfth Embodiment

Figure 37:
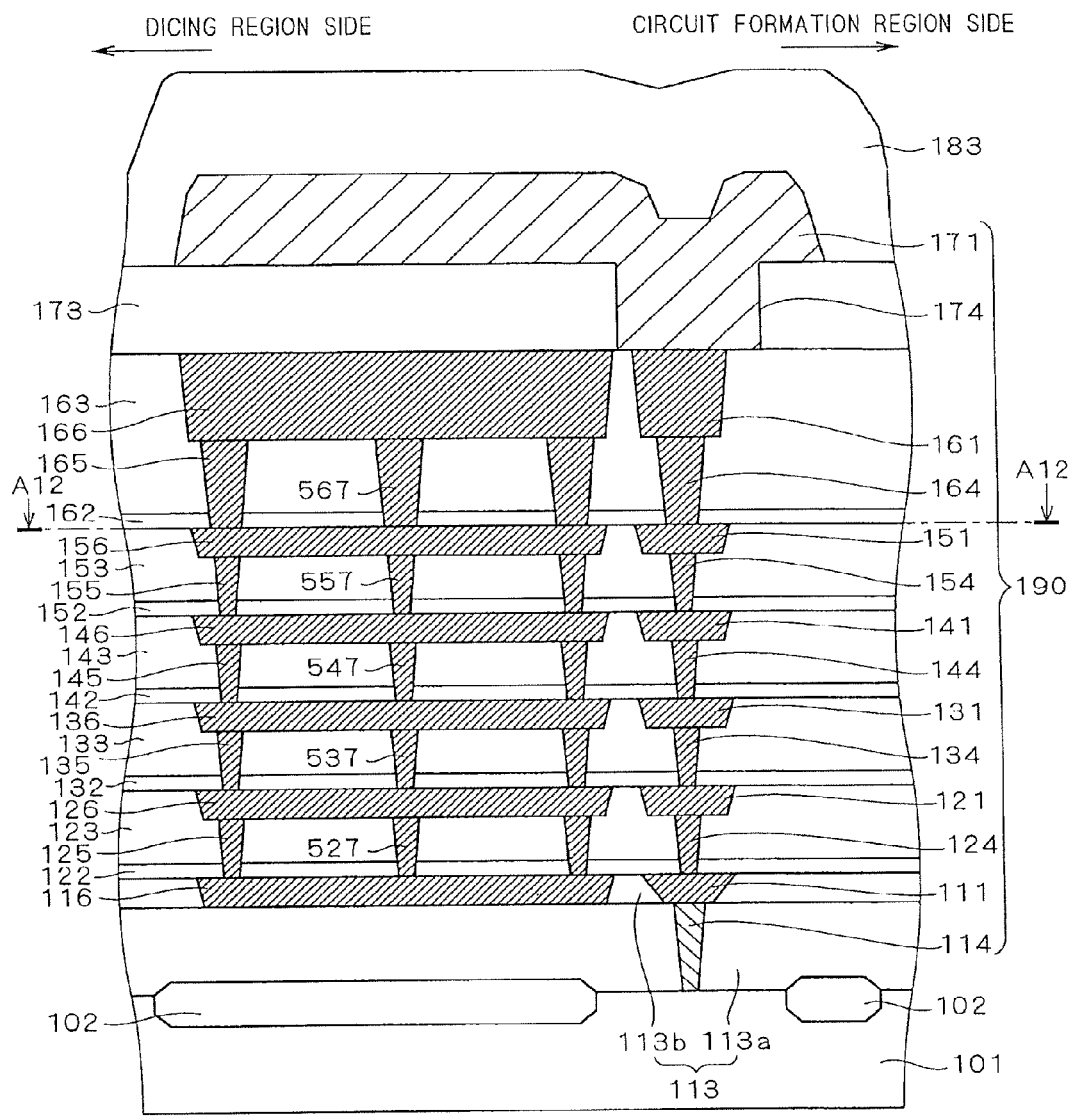
FIG. 37 is a sectional view showing a configuration of a semiconductor device according to a twelfth embodiment.

FIG. 37 shows a configuration of a semiconductor device according to a twelfth embodiment, which is an enlarged sectional view of a region where a seal ring is formed. The twelfth embodiment is gained by combining the second and eleventh embodiments, and the same symbols are attached to the same components as those in the second and eleventh embodiments and the description thereof is omitted.

Here, the manufacturing method is the same as the manufacturing method described in the second embodiment, and therefore, the description thereof is omitted.

Figure 38:
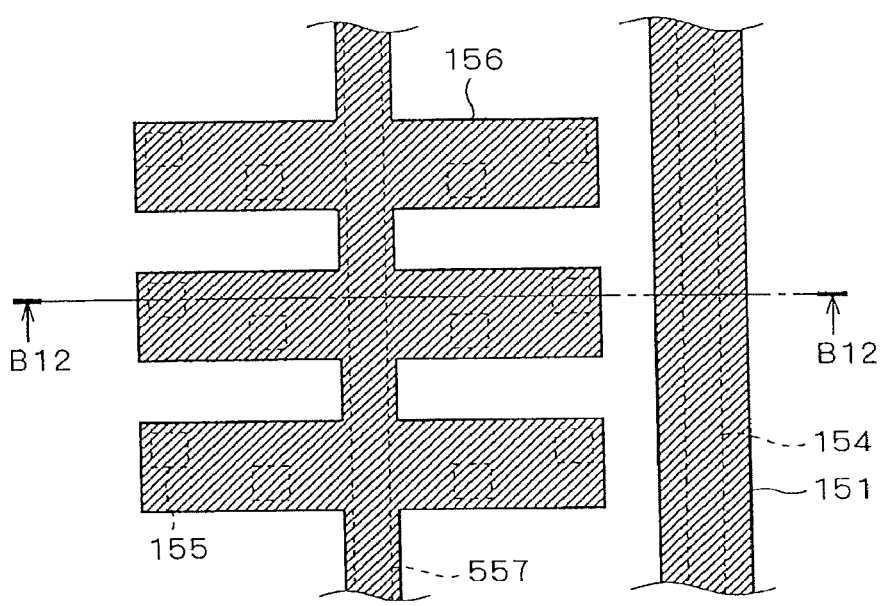
FIG. 38 is a top view showing the configuration of the semiconductor device according to the twelfth embodiment.

FIG. 38 is a top view of the fifth layer. As shown in FIG. 38, a dummy metal 156 is formed so as to cover a dummy slit via 557 and dummy vias 155. In addition, the second to fourth and sixth layers are respectively formed in the same manner. Only dummy metals 116 are formed in the first layer.

In this embodiment, dummy metals are formed so as to cover the dummy slit vias and the dummy vias. Therefore, spreading of cracking that occurs at the time of dicing can further be restricted in comparison with the structure of the eleventh embodiment.

Furthermore, the area where the low-k film makes contact with the diffusion prevention film is reduced by providing dummy metals. As a result, stress between the low-k film and the diffusion prevention film can be relieved. In addition, adhesion between the respective layers can be enhanced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a first region, a second region and a third region, and the first region, the second region and the third region are arranged toward the inside from the outside in this order, a circuit formation region is arranged in the third region and a seal ring is arranged in the second region in a plan view, comprising:
    a silicon substrate;
    a first interlayer insulating film formed over the silicon substrate;
    a first interconnecting layer and a first slit via each formed within the first interlayer insulating film; and
    a first single metal and a plurality of first vias formed in the first interlayer insulating film, and disposed in the first region, wherein the first interconnecting layer and the first slit via form the seal ring, wherein the plurality of first vias are disposed under the first single metal, and wherein the plurality of first vias are connected to the first single metal.

2. The semiconductor device according to claim 1, wherein the first interlayer insulating film is a carbon-containing silicon oxide film.

3. The semiconductor device according to claim 1, wherein the seal ring surrounds the circuit formation region.

4. The semiconductor device according to claim 1, wherein the slit via is longer than each of the first via.

5. The semiconductor device according to claim 1, wherein the first slit via extends along the first interconnecting layer.

6. The semiconductor device according to claim 1, further comprising:
   a second interlayer insulating film formed over the first interlayer insulating film;
   a second interconnecting layer and a second slit via each formed within the second interlayer insulating film; and
   a second single metal and a plurality of second vias formed in the second interlayer insulating film, and disposed in the first region,
   wherein the second interconnecting layer and the second slit via form the seal ring,
   wherein the plurality of second vias are disposed under the second single metal and the plurality of second vias are connected to the second single metal, and
   wherein the second vias are connected to the first single metal.

7. The semiconductor device according to claim 6, wherein the plurality of second vias are integrally formed with the second single metal.

8. The semiconductor device according to claim 1, wherein the plurality of first vias are integrally formed with the first single metal.

9. A semiconductor device having a first region, a second region and a third region, and the first region, the second region and the third region are arranged toward the inside from the outside in this order, a circuit formation region is arranged in the third region and a seal ring is arranged in the second region in a plan view, comprising:
   a silicon substrate;
   a first interlayer insulating film formed over the silicon substrate;
   a first interconnecting layer and a first slit via each formed within the first interlayer insulating film; and
   a first single metal and a second single metal formed in the first interlayer insulating film, and disposed in the first region,
   a first via and a second via disposed under the first single metal and connected to the first single metal;
   a third via and a fourth via disposed under the second single metal and connected to the second single metal,
   wherein the first interconnecting layer and the first slit via form the seal ring,
   wherein the first via and the third via are arranged in a first column which is arranged along the seal ring in a plan view,
   wherein the second via and the fourth via are arranged in a second column which is arranged along the seal ring in a plan view, and
   wherein the second via in the second column is disposed between adjacent the first via and the third via in the first column, in a direction perpendicular to the seal ring in a plan view.

10. The semiconductor device according to claim 9, wherein the first column and the second column are arranged adjacently in a plan view.

11. The semiconductor device according to claim 9, wherein the first via and third via of the first column are arranged with a first pitch and the second via and fourth via of the second column are arranged with a second pitch in a plan view.

12. The semiconductor device according to claim 11, wherein the first pitch is equal to the second pitch.

13. The semiconductor device according to claim 11, wherein the vias of the first column are shifted by half a pitch from the vias of the second column in a plan view.

14. The semiconductor device according to claim 9, wherein the first via and the second via are integrally formed with the first single metal, and
   wherein the third via and the fourth via are integrally formed with the second single metal.

* * * * *